US012622093B2

(12) United States Patent
Yang et al.

(10) Patent No.: US 12,622,093 B2
(45) Date of Patent: May 5, 2026

(54) CHIP TRANSFERRING APPARATUS FOR SELF-ASSEMBLY AND METHOD FOR SUPPLYING SEMICONDUCTOR LIGHT EMITTING DIODE

(71) Applicant: LG ELECTRONICS INC., Seoul (KR)

(72) Inventors: Inbum Yang, Seoul (KR); Junghun Rho, Seoul (KR); Sangsik Jung, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1081 days.

(21) Appl. No.: 17/793,244

(22) PCT Filed: Feb. 13, 2020

(86) PCT No.: PCT/KR2020/002020
§ 371 (c)(1),
(2) Date: Jul. 15, 2022

(87) PCT Pub. No.: WO2021/054547
PCT Pub. Date: Mar. 25, 2021

(65) Prior Publication Data
US 2023/0061671 A1 Mar. 2, 2023

(30) Foreign Application Priority Data

Sep. 19, 2019 (KR) ........................ 10-2019-0115574
Jan. 22, 2020 (KR) ........................ 10-2020-0008861

(51) Int. Cl.
*H10H 20/01* (2025.01)
*H01L 25/075* (2006.01)

(52) U.S. Cl.
CPC ......... *H10H 20/01* (2025.01); *H01L 25/0753* (2013.01)

(58) Field of Classification Search
CPC ......... H01L 21/67144; H01L 21/67333; H01L 21/68; H01L 2224/95001;
(Continued)

(56) References Cited

U.S. PATENT DOCUMENTS

2012/0291950 A1* 11/2012 Sugiyama ........... H01L 21/6835
156/60
2017/0062393 A1 3/2017 Kim
(Continued)

FOREIGN PATENT DOCUMENTS

EP 4012769 A1 6/2022
JP 9-153541 A 6/1997
(Continued)

*Primary Examiner* — Minh N Trinh
(74) *Attorney, Agent, or Firm* — Birch, Stewart, Kolasch & Birch, LLP

(57) ABSTRACT

A chip transferring apparatus for supplying a micro-LED provides a chip tray for carrying semiconductor light emitting diodes in a fluid received in an assembly chamber. The transferring apparatus includes a tray unit for receiving a plurality of semiconductor light emitting diodes, a chip alignment unit disposed on one side of the tray unit and having a plurality of magnets, and a transfer unit configured to move the tray unit and the chip alignment unit. The transfer unit can vertically move one of the tray unit and the chip alignment unit with respect to the other one thereof.

14 Claims, 23 Drawing Sheets

(58) Field of Classification Search
 CPC . H01L 2224/95101; H01L 2224/95144; H01L
                                                    24/95
 See application file for complete search history.

(56)                  References Cited

U.S. PATENT DOCUMENTS

| 2017/0229330 | A1  | 8/2017 | Tkachenko et al. | |
| 2018/0102352 | A1* | 4/2018 | Sasaki | H10H 29/14 |
| 2023/0048122 | A1  | 2/2023 | Yu et al. | |
| 2023/0061671 | A1* | 3/2023 | Yang | H01L 24/95 |

FOREIGN PATENT DOCUMENTS

| KR | 20120113086 A | * 10/2012 | G01R 31/2601 |
| KR | 10-2017-0026957 A | 3/2017 | |
| KR | 10-2017-0071514 A | 6/2017 | |
| KR | 10-2019-0017691 A | 2/2019 | |
| KR | 10-2019-0099164 A | 8/2019 | |
| KR | 10-2020-0005516 A | 1/2020 | |

* cited by examiner

[FIG. 1]
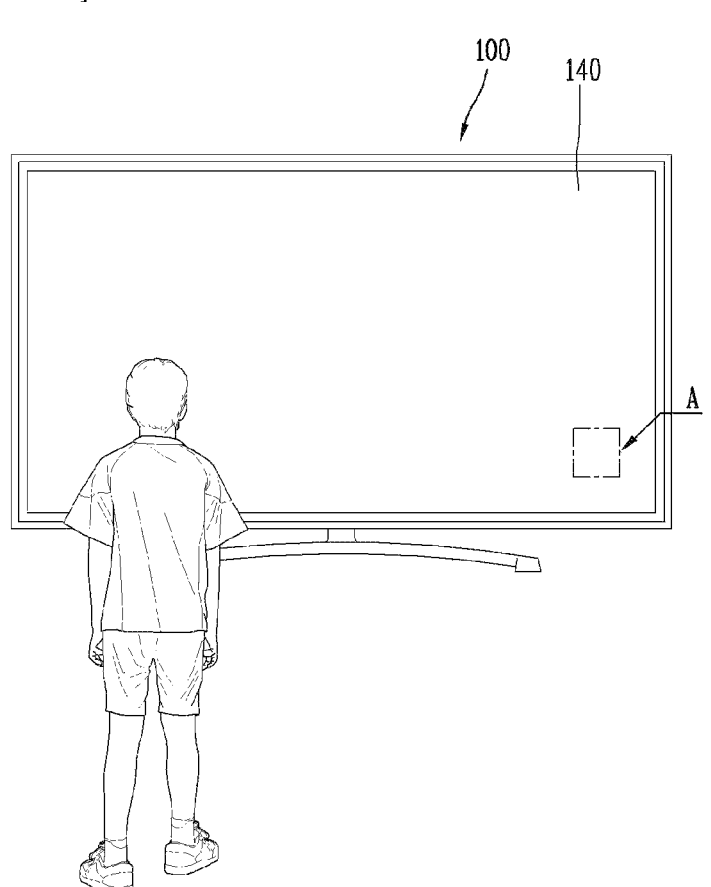

[FIG. 2]
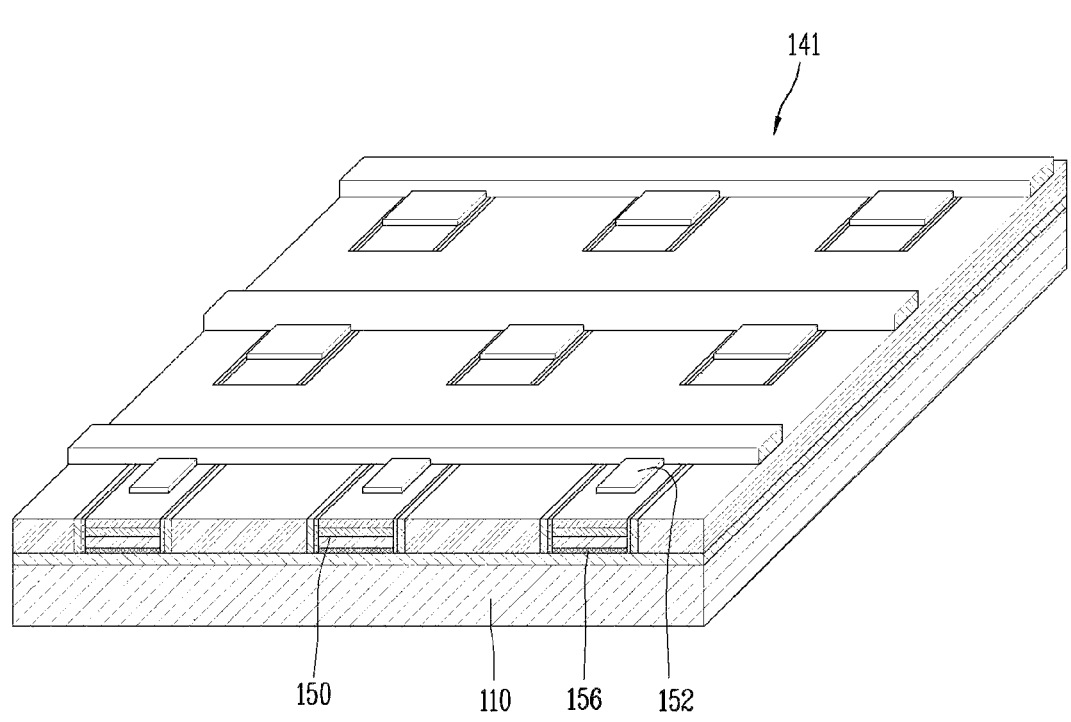
[FIG. 3]
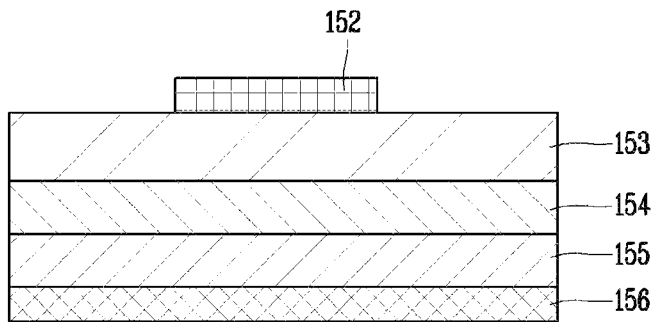

[FIG. 4]
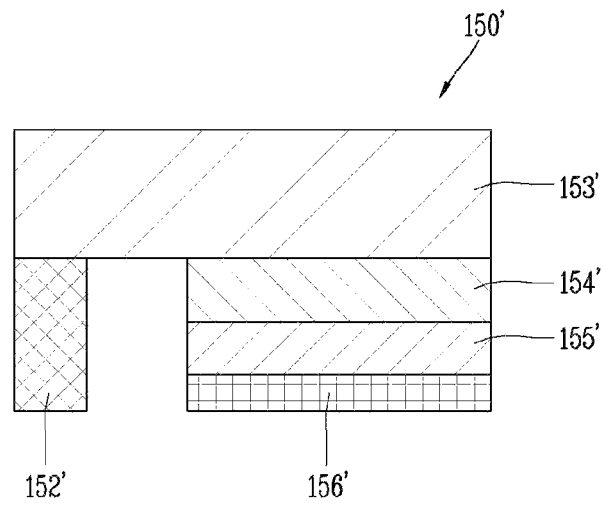
[FIG. 5A]
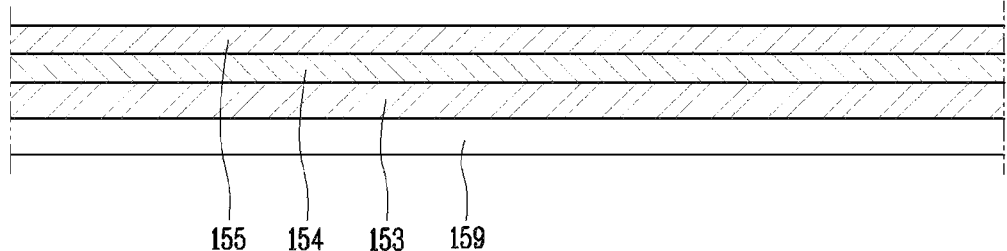
[FIG. 5B]
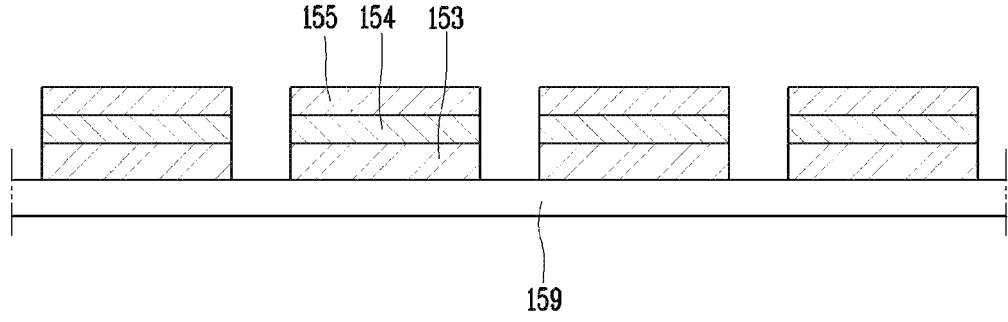

[FIG. 5C]
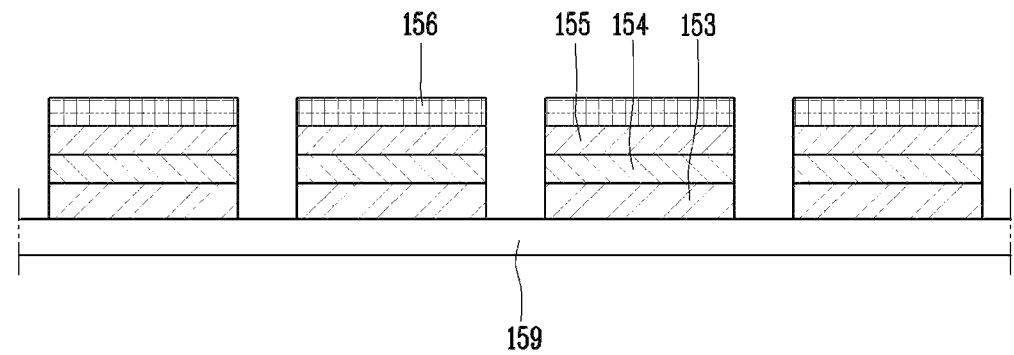
[FIG. 5D]
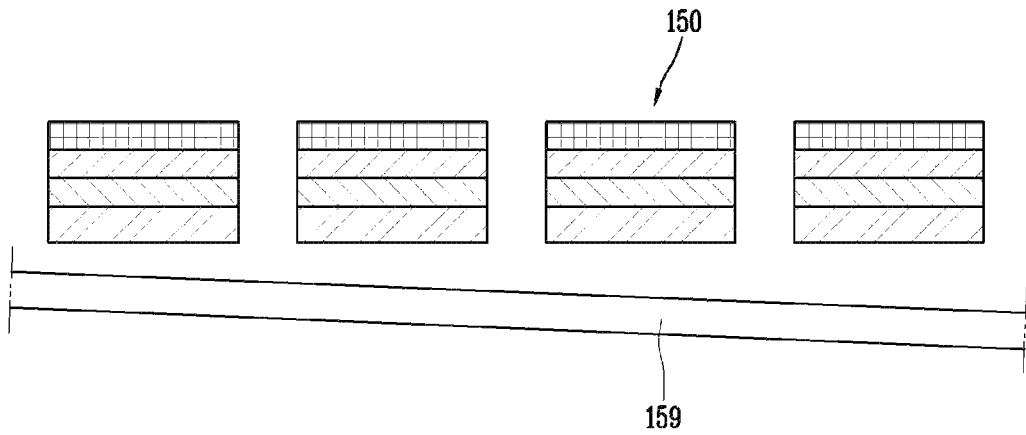
[FIG. 5E]
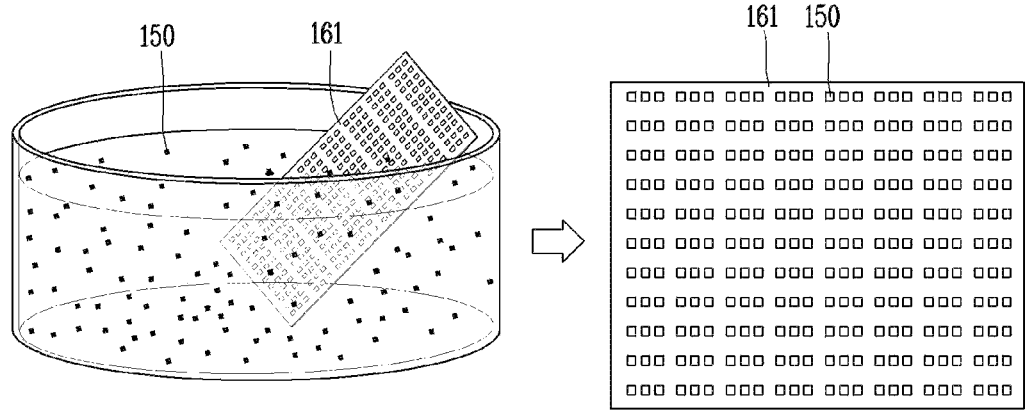

[FIG. 6]
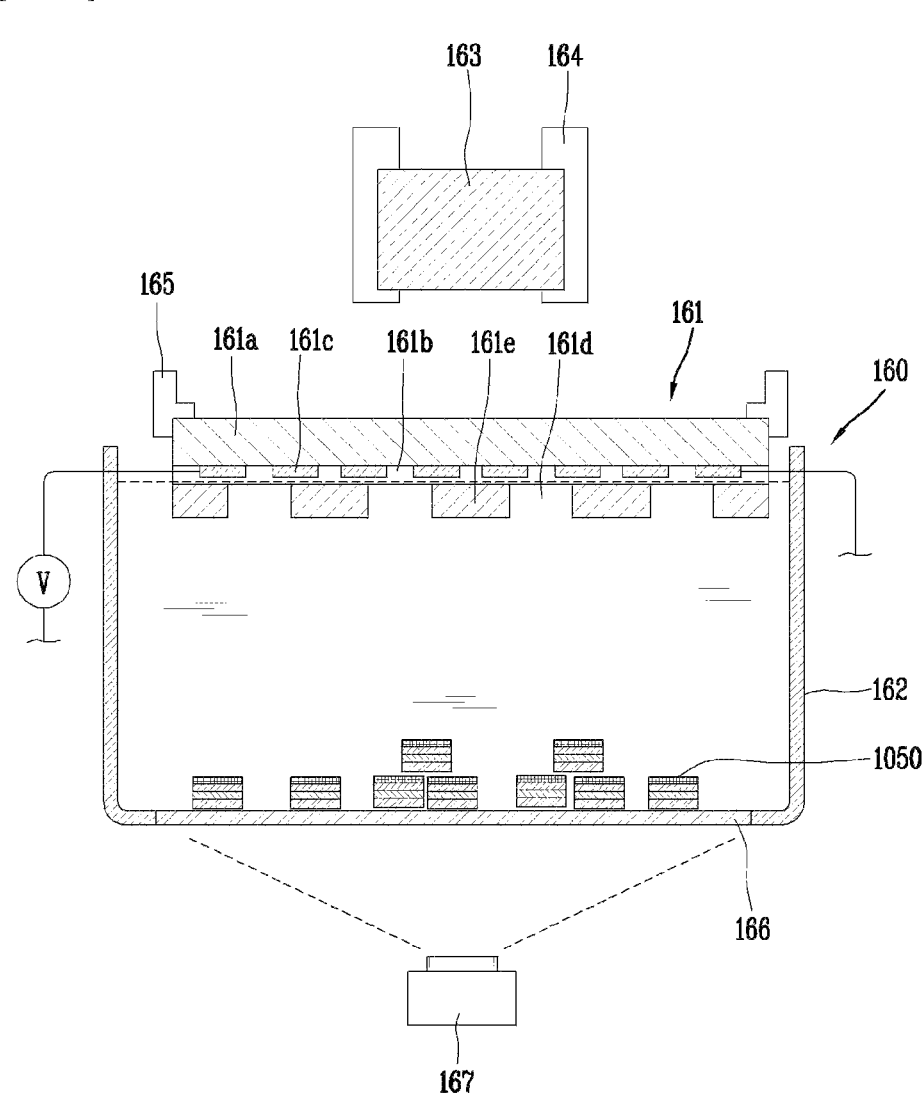

[FIG. 7]
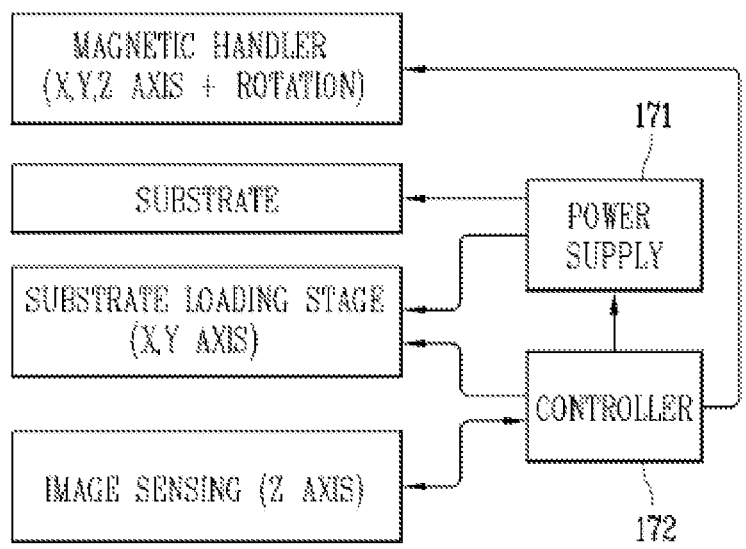
[FIG. 8A]
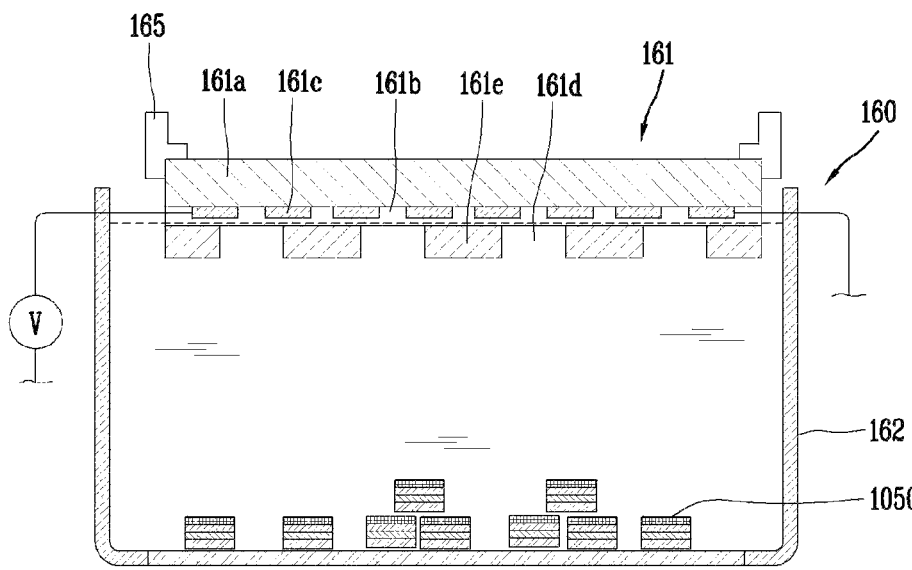

[FIG. 8B]
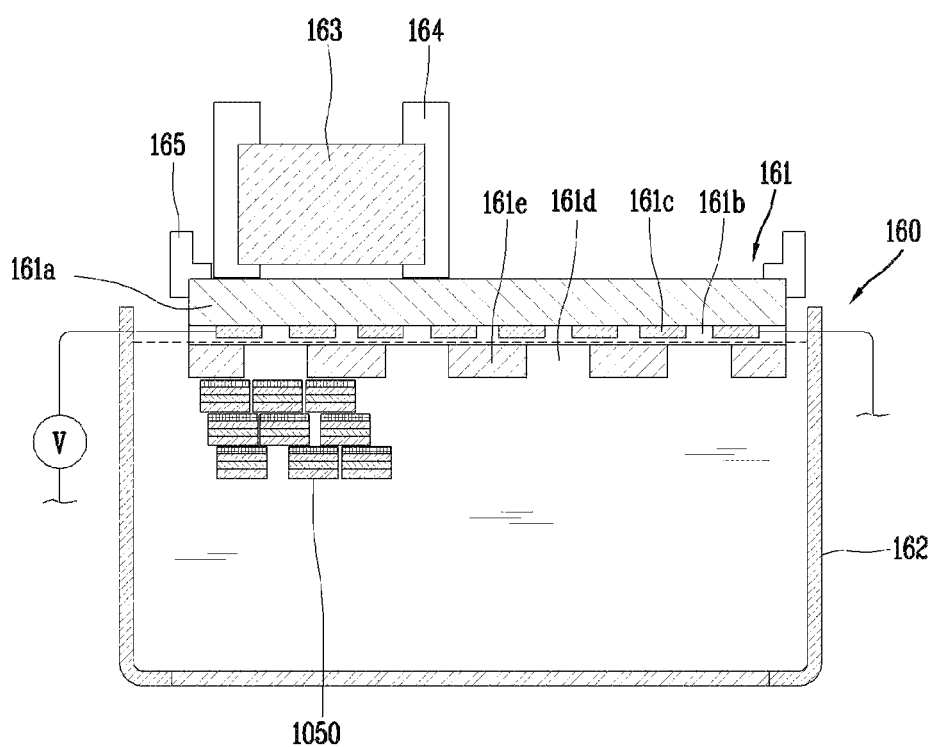

[FIG. 8C]
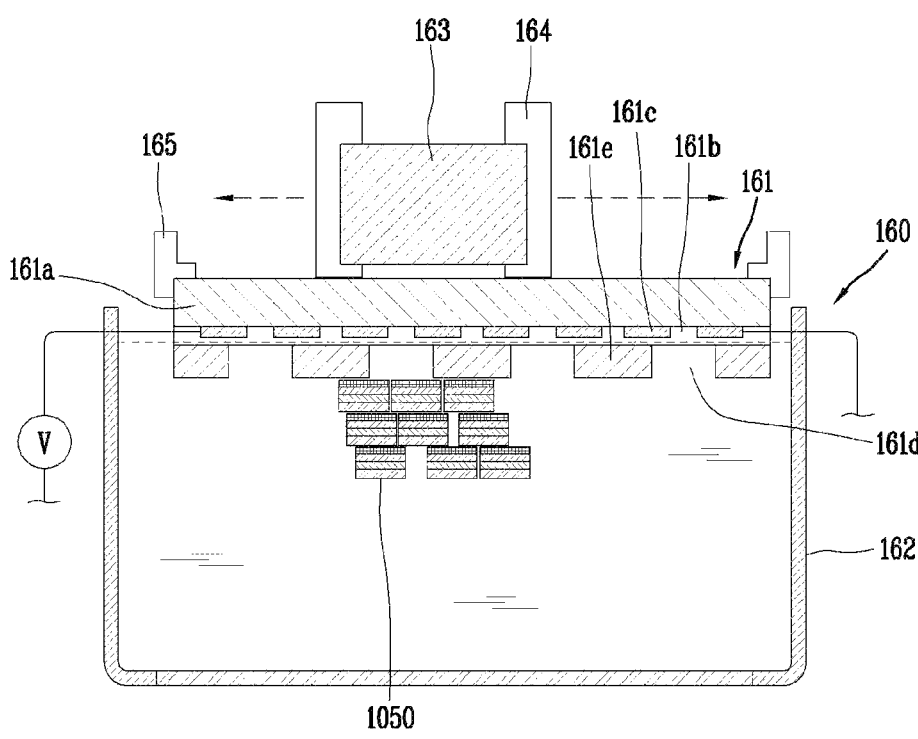
[FIG. 8D]
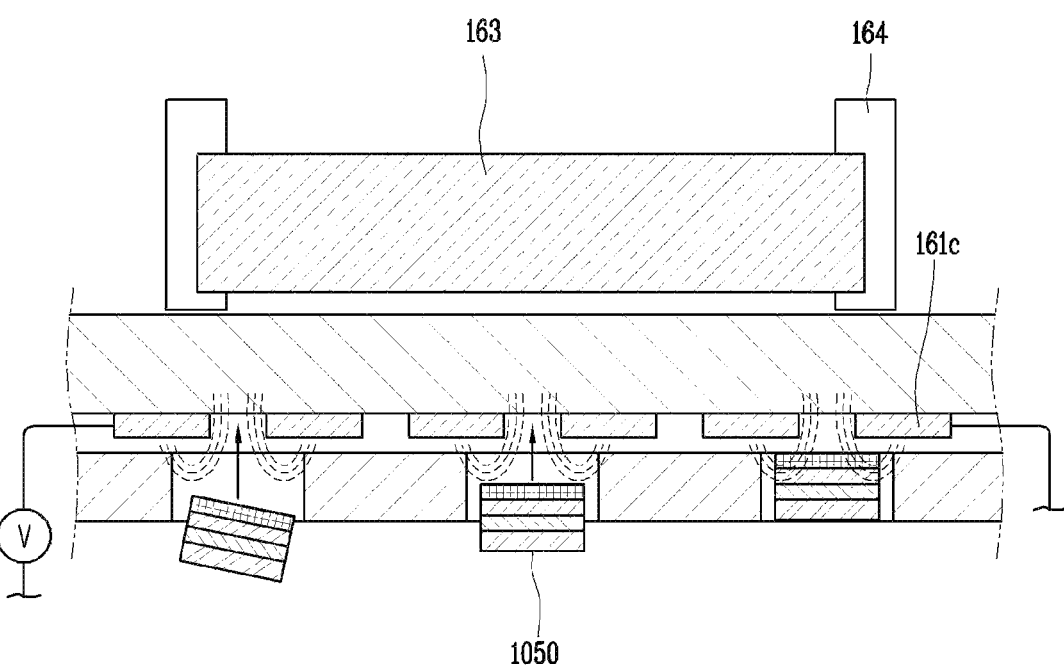

[FIG. 8E]
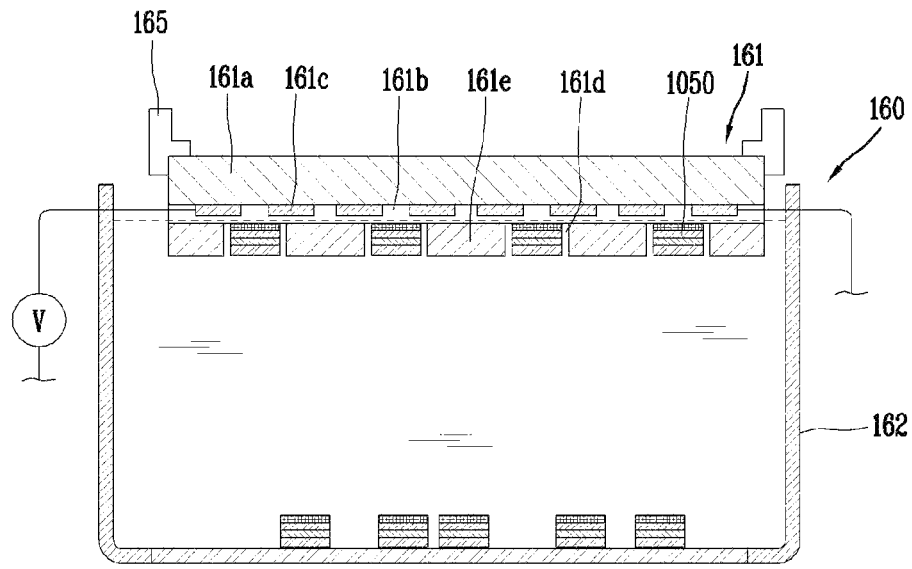
[FIG. 9]
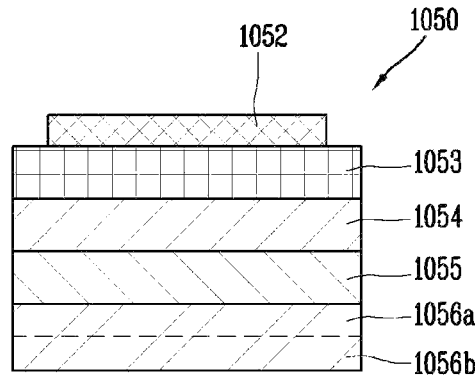
[FIG. 10]
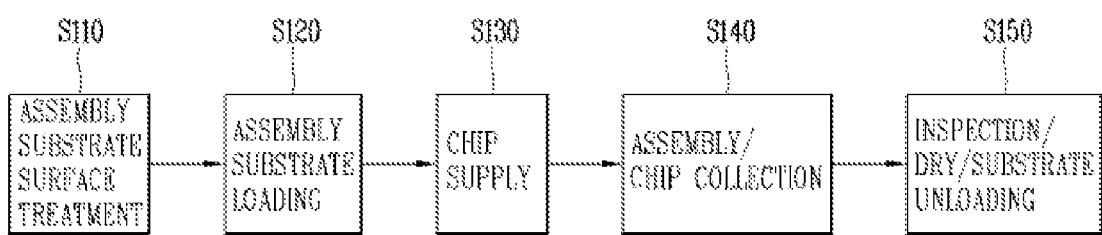

[FIG. 11]
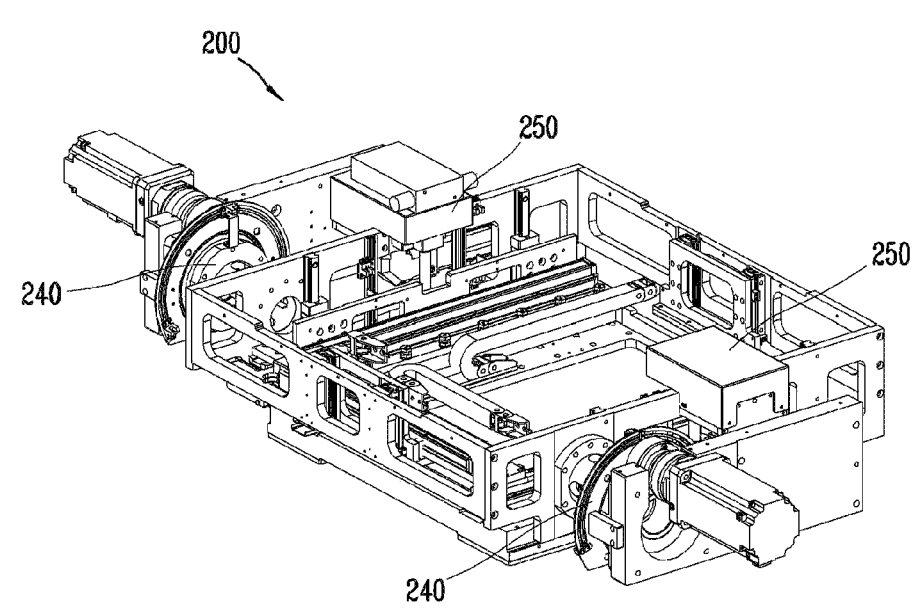
[FIG. 12]
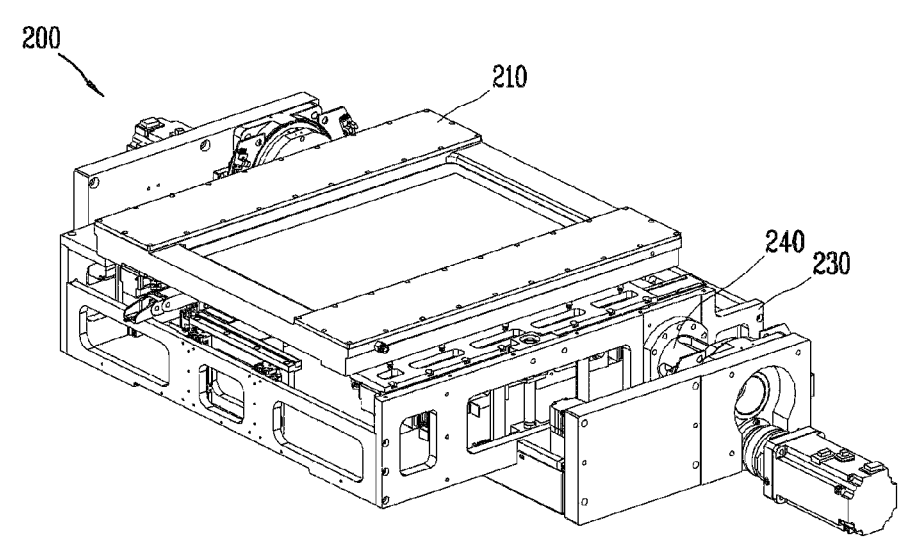

[FIG. 13]
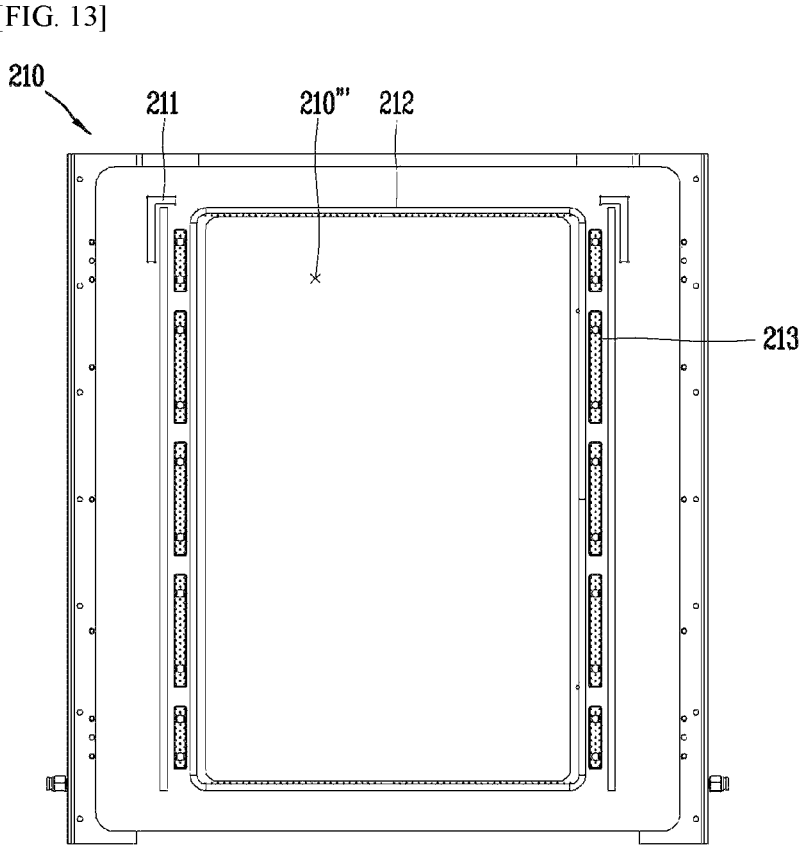

[FIG. 14]
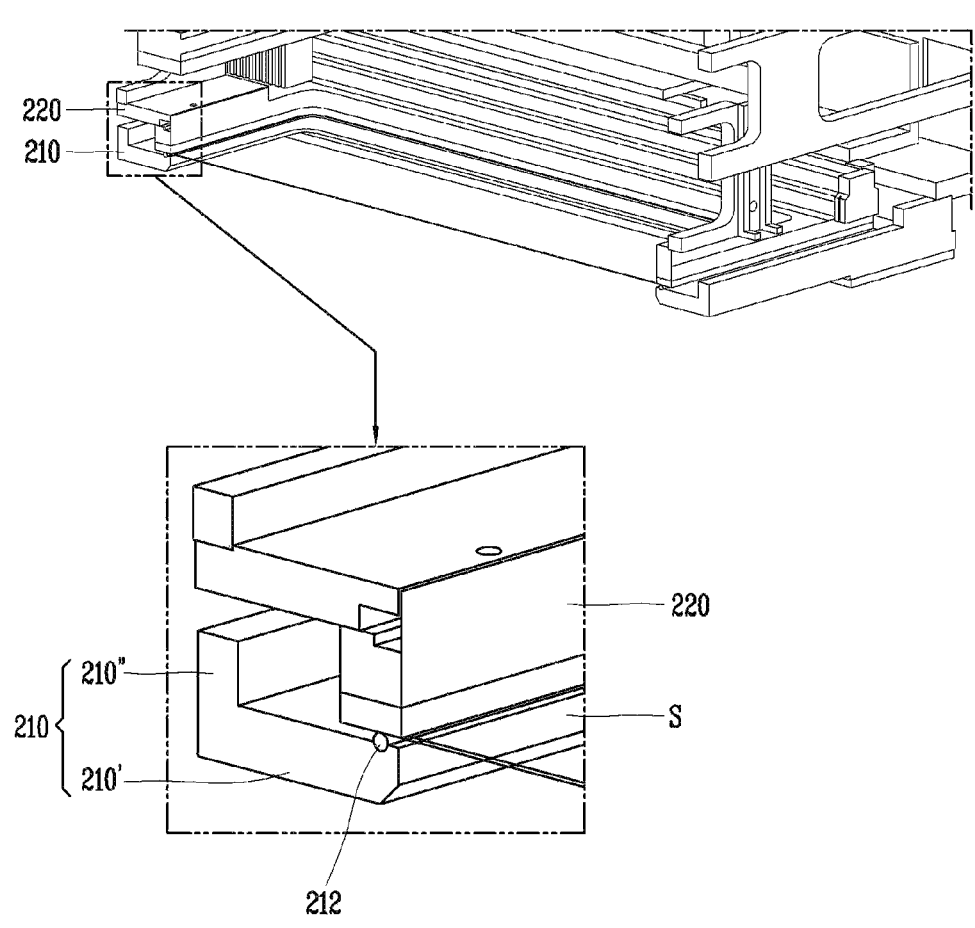

[FIG. 15]
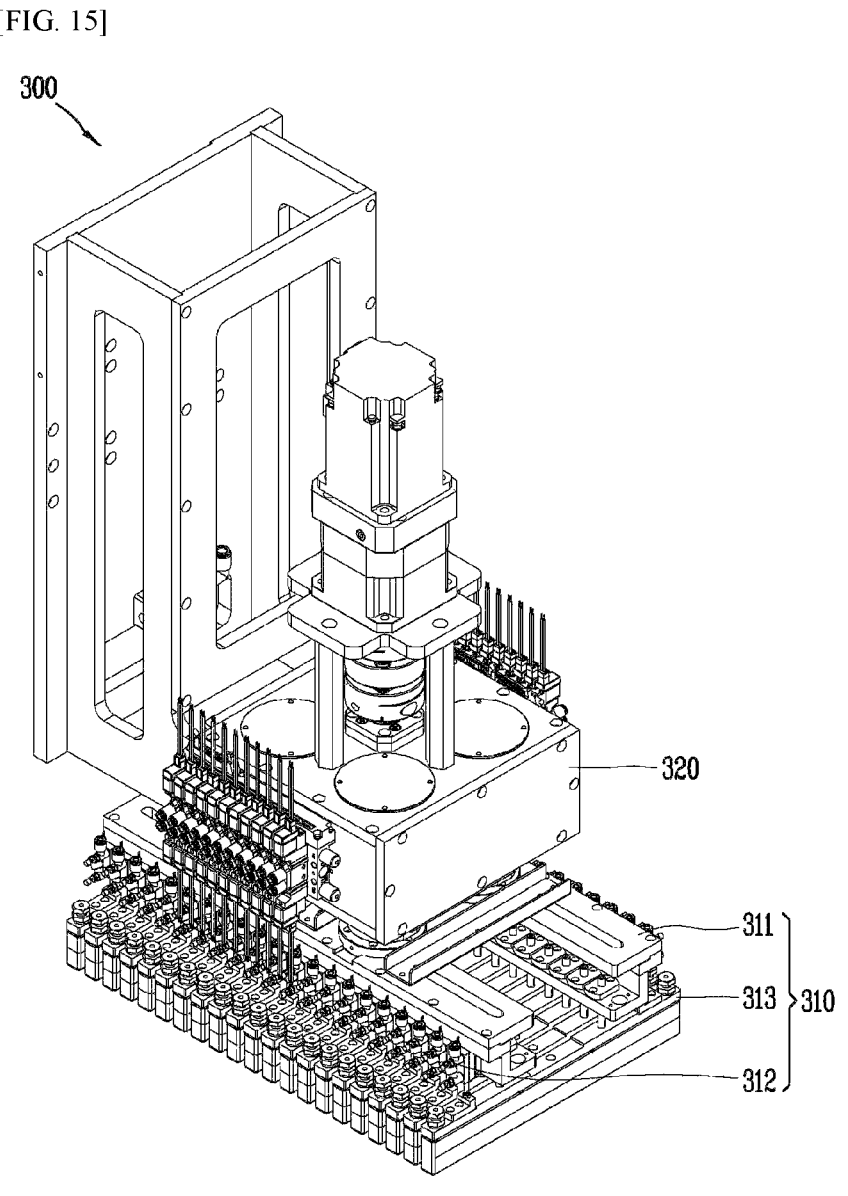

[FIG. 16]
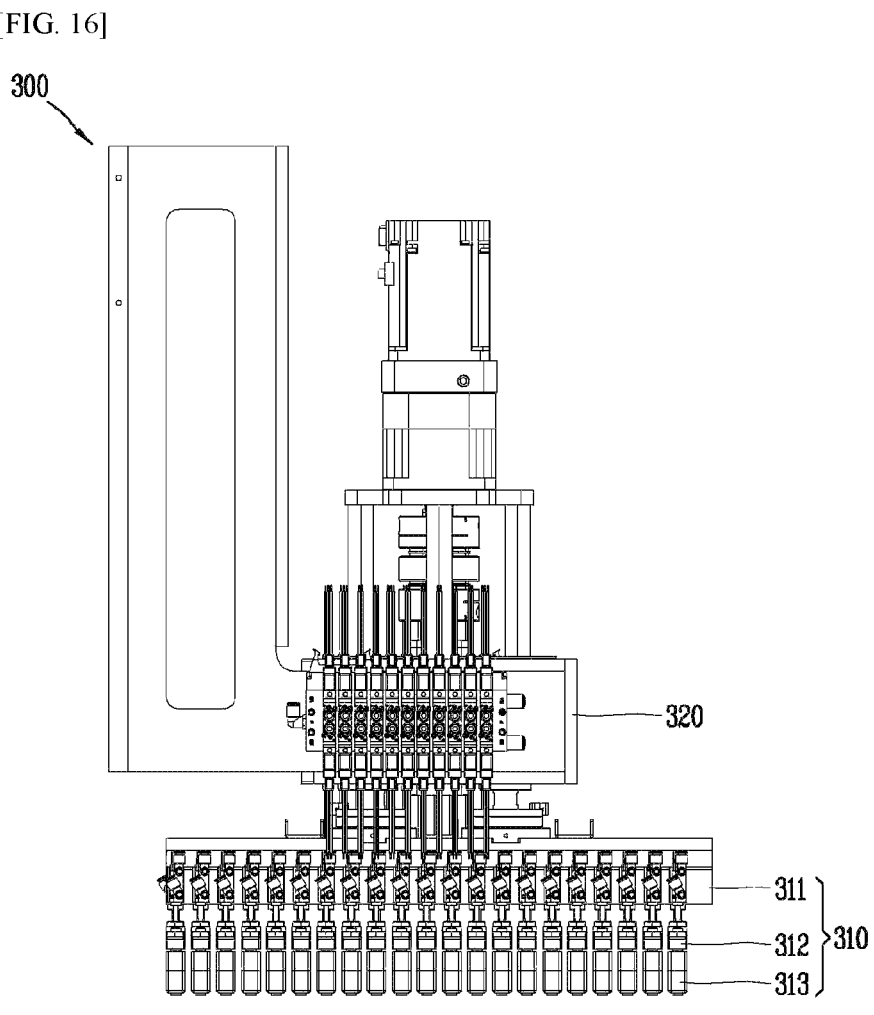
[FIG. 17]
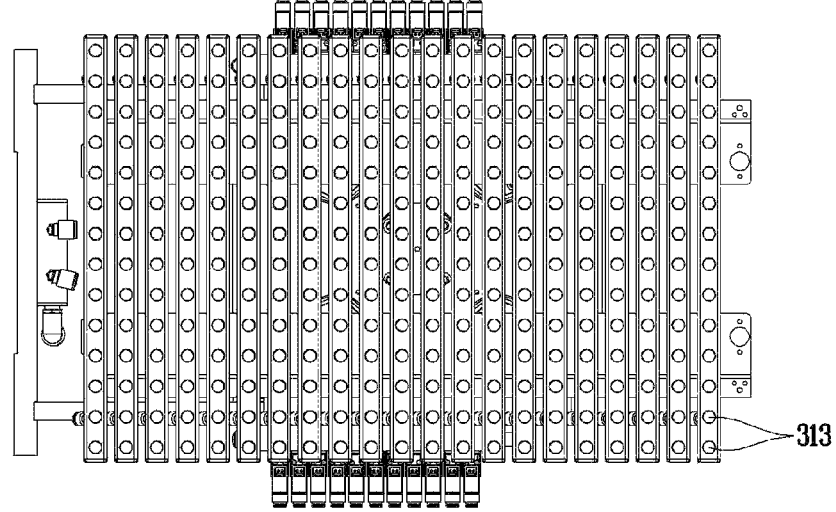

[FIG. 18]
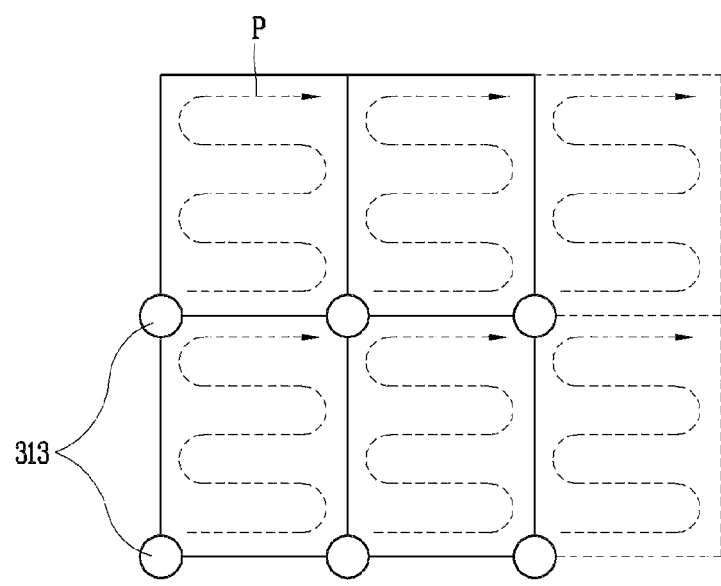
[FIG. 19]
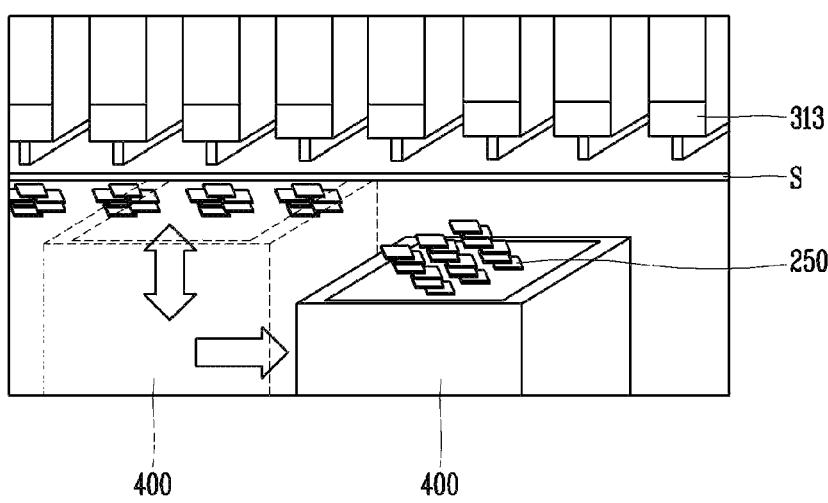

[FIG. 20]
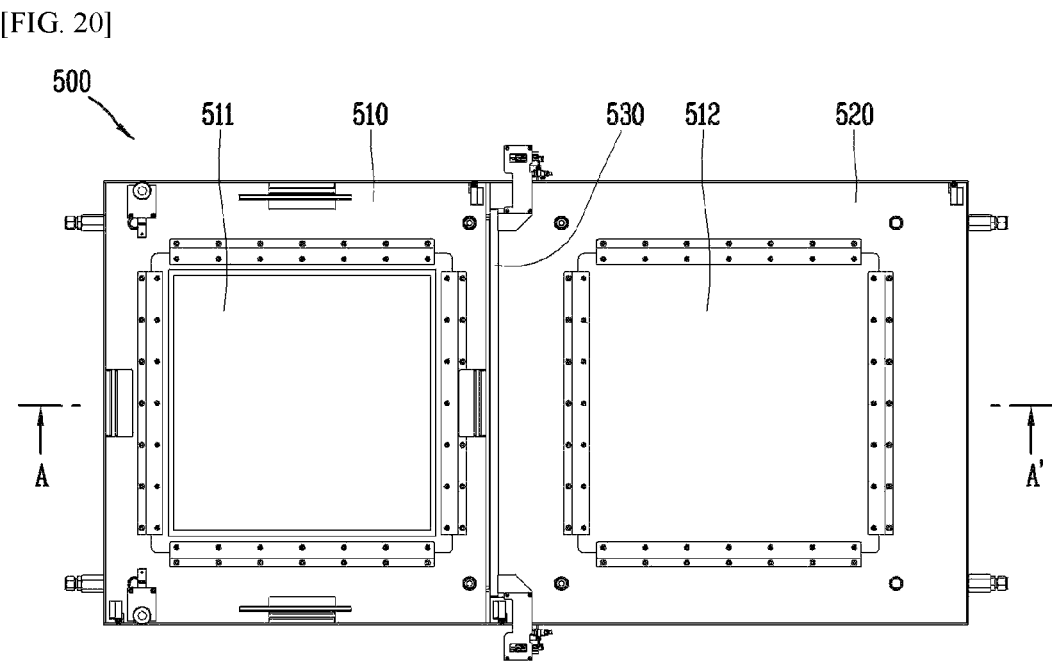
[FIG. 21]
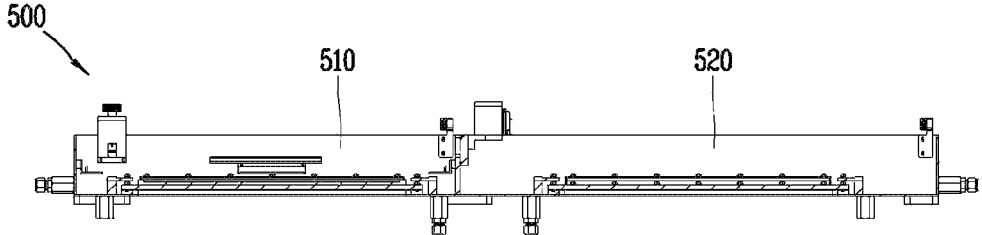

[FIG. 22]
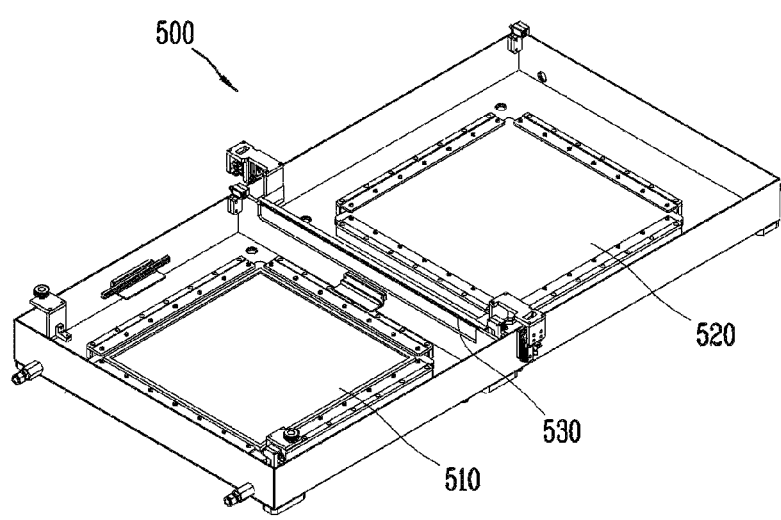
[FIG. 23]
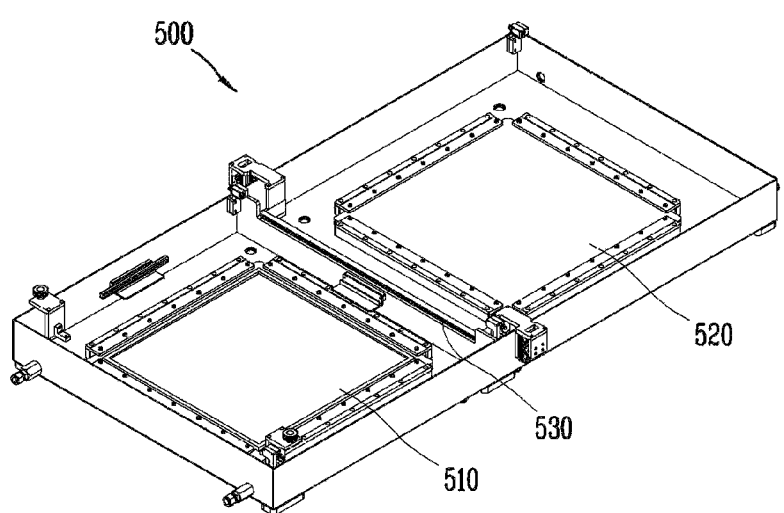
[FIG. 24]
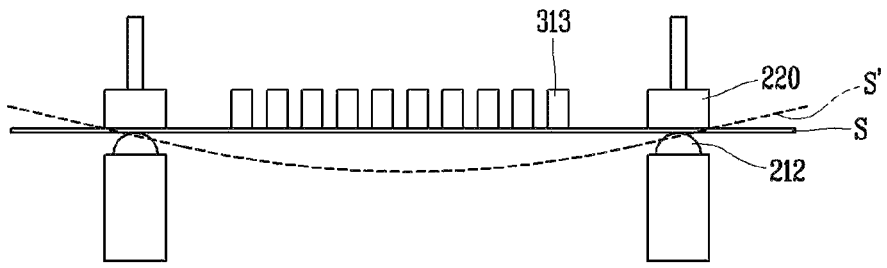

[FIG. 25]
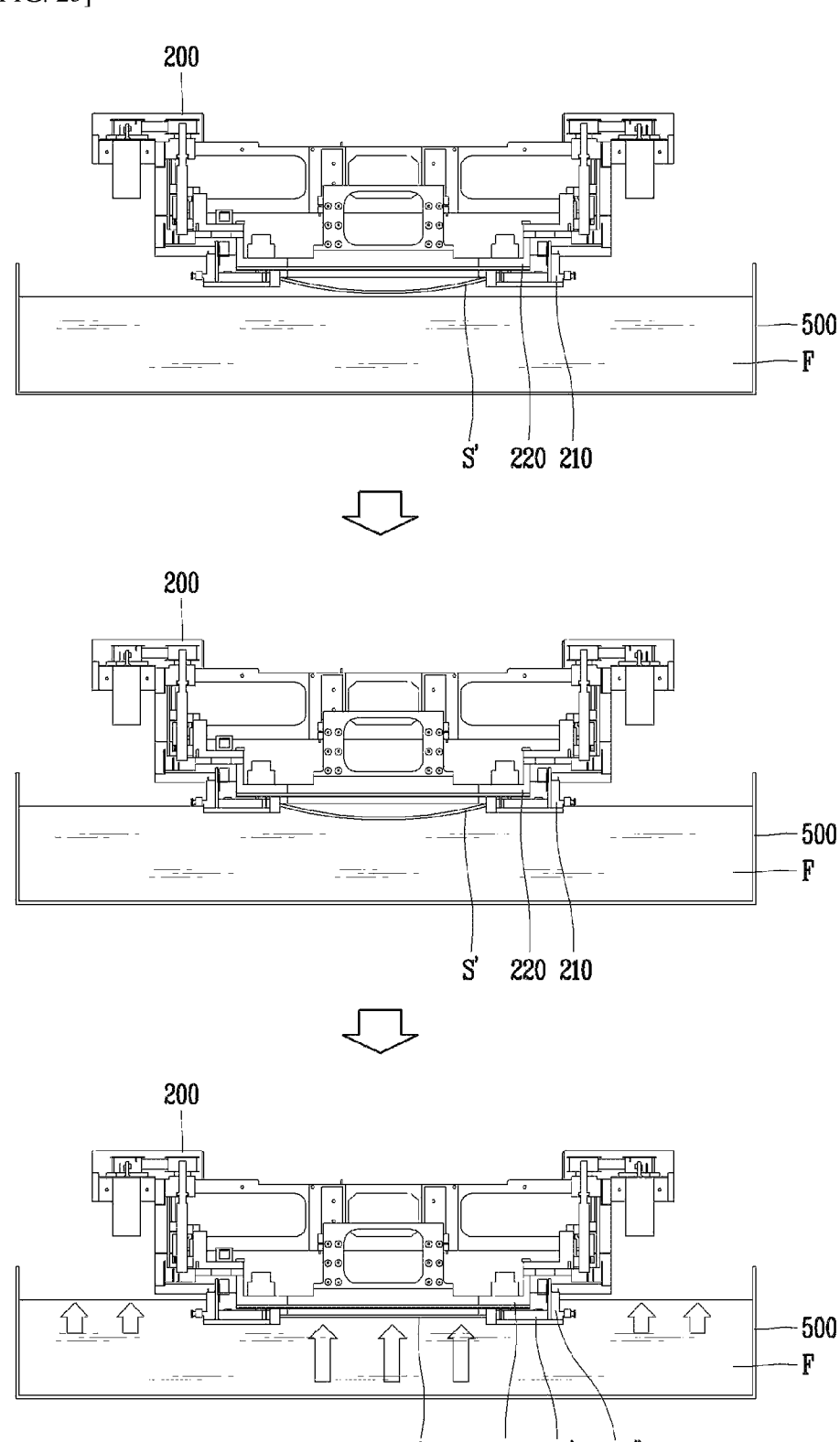

Initial State     Coating
of fist row     Coating
of second row     Coating
of third row

[FIG. 31]
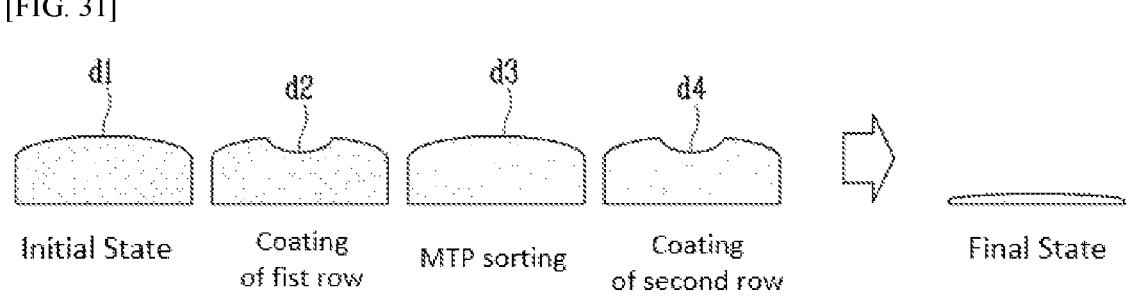
Initial State     Coating of fist row     MTP sorting     Coating of second row     Final State
[FIG. 32]
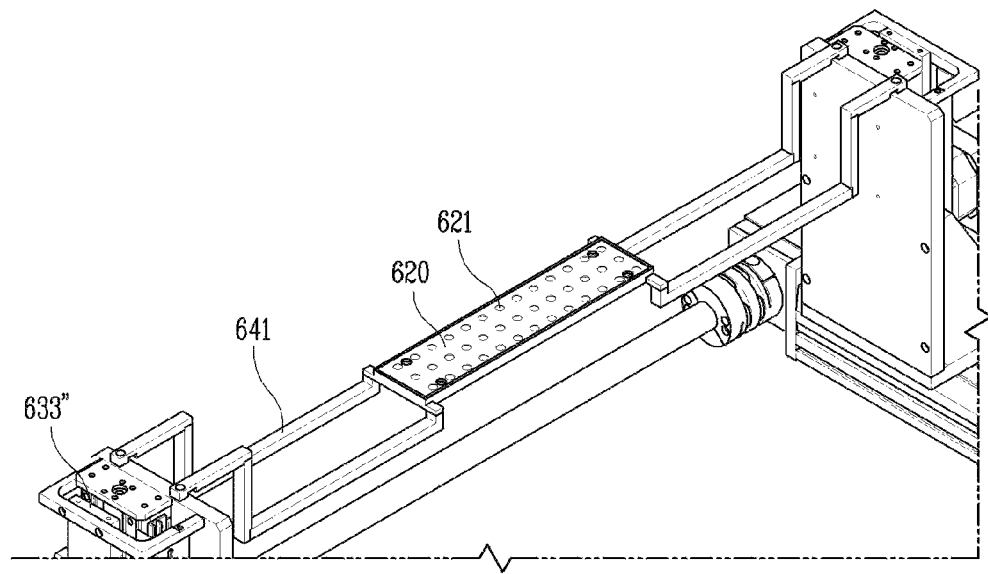

[FIG. 33]
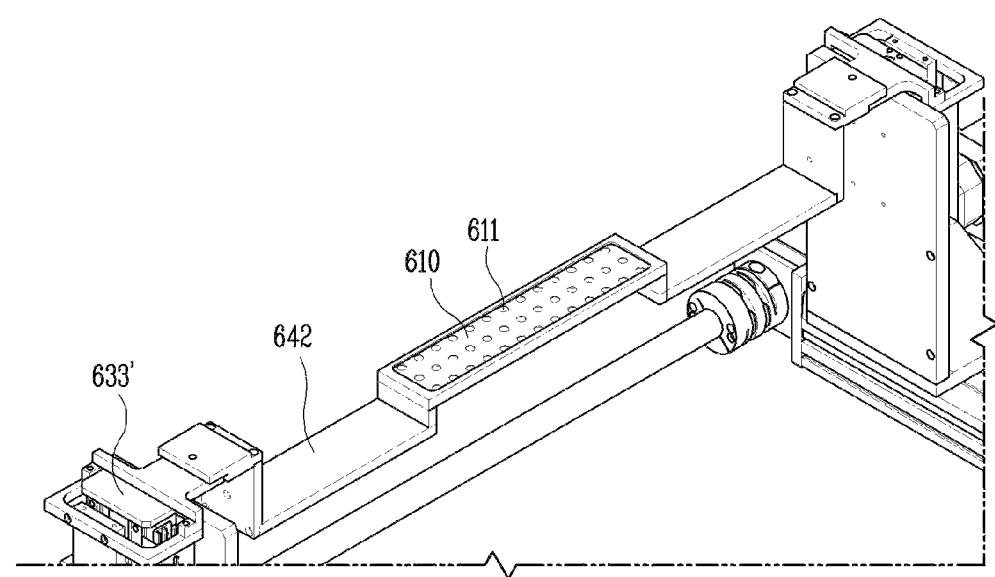
[FIG. 34]
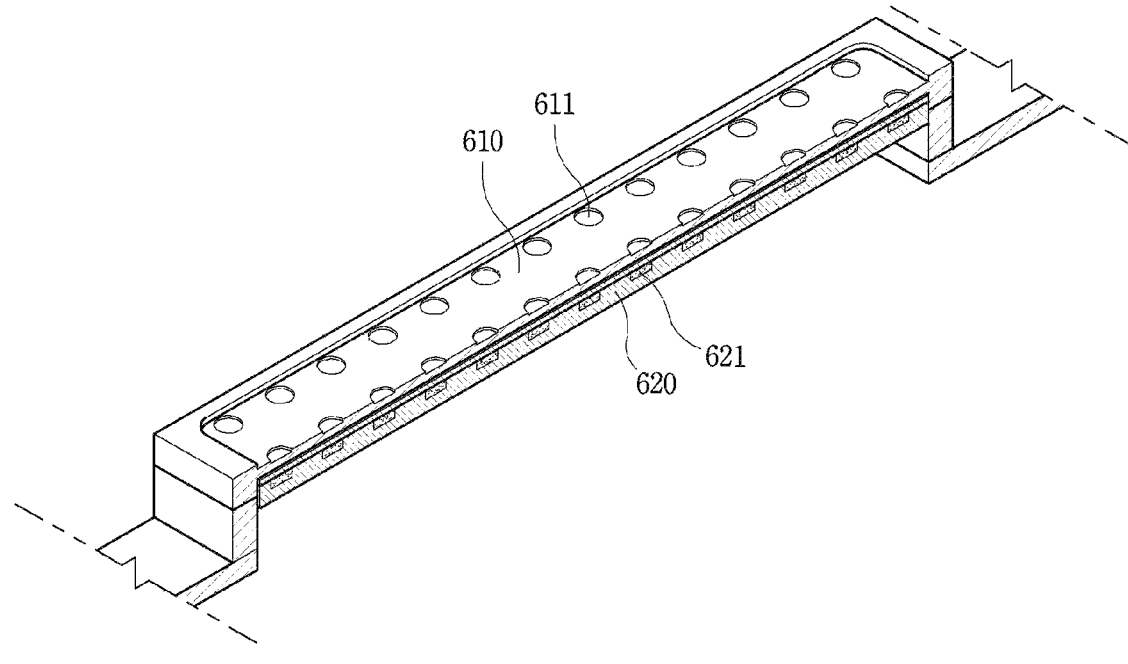

[FIG. 35]
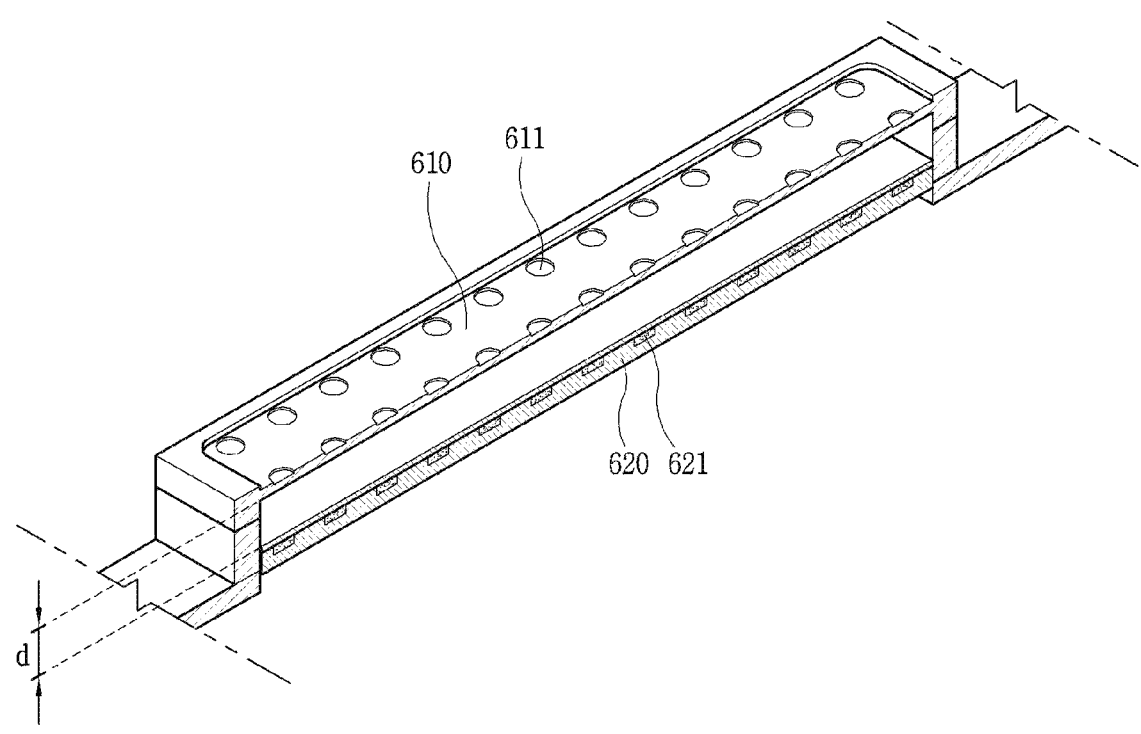

CHIP TRANSFERRING APPARATUS FOR SELF-ASSEMBLY AND METHOD FOR SUPPLYING SEMICONDUCTOR LIGHT EMITTING DIODE

CROSS REFERENCE TO RELATED APPLICATIONS

This application is the National Phase of PCT/KR2020/002020 filed on Feb. 13, 2020, which claims priority under 35 U.S.C. § 119(a) to Patent Application Nos. 10-2019-0115574 and 10-2020-0008861 filed in the Republic of Korea on Sep. 19, 2019 and Jan. 22, 2020, respectively, all of these applications are hereby expressly incorporated by reference into the present application.

TECHNICAL FIELD

The present disclosure relates to a method for manufacturing a display device, and more particularly, to a chip tray for suppling a micro-LED.

BACKGROUND ART

In recent years, in the field of display technology, liquid-crystal displays (LCD), organic light-emitting diode (OLED) displays, micro-LED displays, etc. have been competing to realize large-area displays.

Meanwhile, semiconductor light-emitting diodes (micro-LEDs ($\mu$LED)) with a diameter or cross-sectional area less than 100 microns, when used in displays, can offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick and place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a micro-LED structure suitable for self-assembly, but there is not enough research being carried out on technologies for manufacturing displays by the self-assembly of micro-LEDs. In view of this, the present disclosure proposes a new manufacturing device for self-assembling micro-LEDs.

DISCLOSURE

Technical Problem

One object of the present invention is to provide a new manufacturing process having high reliability in a large-screen display using a micro-sized semiconductor light emitting device.

Another object of the present invention is to provide an apparatus for uniformly supplying a semiconductor light emitting device during self-assembly.

Technical Solution

In order to achieve the above object, the present invention provides a chip tray for transferring semiconductor light emitting devices in a fluid contained in an assembly chamber. The chip tray includes a tray unit for accommodating a plurality of semiconductor light emitting devices, a chip alignment unit disposed on one side of the tray unit, a chip alignment unit including a plurality of magnets, and a transfer unit configured to move the tray unit and the chip alignment unit. The transfer unit is characterized in that it is configured to vertically move any one of the tray unit and the chip alignment unit with respect to the other one.

In an embodiment, the transfer unit may bring the tray unit closer to the assembly substrate within a predetermined distance so that some of the semiconductor light emitting devices accommodated in the tray unit are aligned on the surface of the assembly substrate submerged in the fluid.

In an embodiment, the transfer unit may bring the tray unit closer to the assembly substrate within a predetermined distance in a state where the tray unit and the chip alignment unit are spaced apart from each other by a predetermined distance.

In an embodiment, the transfer unit may separate the tray unit from the assembly substrate by a predetermined distance or more after some of the semiconductor light emitting devices accommodated in the tray unit move to the assembly substrate.

In one embodiment, the transfer unit may vertically move so that the tray unit and the chip alignment unit are adjacent to each other within a predetermined distance after some of the semiconductor light emitting devices accommodated in the tray unit are moved to the assembly substrate.

In an embodiment, the tray unit may include a plurality of recesses, and the magnets provided in the chip alignment unit may be disposed at the same intervals as the plurality of recesses.

In an embodiment, the plurality of recesses and the magnets may be arranged to overlap each other.

In one embodiment, the tray unit and the chip alignment unit may further include a connection unit for connecting the transfer unit.

In an embodiment, the connection unit includes first and second connection units, the first connection unit is configured to connect a portion of the transfer unit in which a vertical movement does not occur and the chip alignment unit, and the second connection unit may connect a portion of the transfer unit in which a vertical movement occurs and the tray unit.

The present invention also provides a method for supplying semiconductor light emitting devices to an assembly substrate in a fluid contained in an assembly chamber. Specifically, the present invention includes the steps of: supplying a semiconductor light emitting device on a tray unit, a transport part transporting the tray unit upward with respect to the bottom surface of the assembly chamber, so that the tray unit approaches the assembly substrate within a predetermined distance. After some of the semiconductor light emitting devices accommodated in the tray unit move to the assembly substrate, the method includes the step of lowering the tray unit by the transfer unit after some of the semiconductor light emitting devices accommodated in the tray unit move to the assembly substrate; and horizontally transporting the tray unit with respect to a bottom surface of the assembly chamber. And the step of lowering the tray unit by the transfer unit is performed so that the tray unit approaches the chip alignment unit including a plurality of magnets.

Advantageous Effects

With the above configuration according to the present disclosure, large numbers of semiconductor light-emitting diodes can be assembled at a time on a display device where individual pixels are made up of micro-LEDs.

As such, according to the present disclosure, large numbers of semiconductor light-emitting diodes can be pixelated on a small-sized wafer and then transferred onto a large-area substrate. This enables the manufacture of a large-area display device at a low cost.

Moreover, according to the present disclosure, a low-cost, high-efficiency, and quick transfer of semiconductor light-emitting diodes can be done, regardless of the sizes or numbers of parts and the transfer area, by transferring them in the right positions in a solution by using a magnetic field and an electric field.

Furthermore, the assembling of semiconductor light-emitting diodes by an electric field allows for selective assembling through selective electrical application without any additional equipment or processes. Also, since an assembly substrate is placed on top of a chamber, the substrate can be easily loaded or unloaded, and non-specific binding of semiconductor light-emitting diodes can be prevented.

According to the present invention, even if the number of times the chip tray supplies the semiconductor light emitting device to the assembly substrate increases, the amount of the semiconductor light emitting device supplied from the chip tray to the assembly substrate is not reduced. Accordingly, according to the present invention, the semiconductor light emitting device can be uniformly supplied to the entire assembly substrate.

DESCRIPTION OF DRAWINGS

FIG. 1 is a conceptual diagram showing one embodiment of a display device using semiconductor light-emitting diodes according to the present disclosure.

FIG. 2 is a partial enlarged view of the portion A in the display device of FIG. 1.

FIG. 3 is an enlarged view of the semiconductor light-emitting diodes of FIG. 2.

FIG. 4 is an enlarged view showing another embodiment of the semiconductor light-emitting diodes of FIG. 2.

FIGS. 5A to 5E are conceptual diagrams for explaining a new process for manufacturing the above-described semiconductor light-emitting diodes.

FIG. 6 is a conceptual diagram showing an example of a device for self-assembling semiconductor light-emitting diodes according to the present disclosure.

FIG. 7 is a block diagram of the self-assembly device of FIG. 6.

FIGS. 8A to 8E are conceptual diagrams showing a process for self-assembling semiconductor light-emitting diodes using the self-assembly device of FIG. 6.

FIG. 9 is a conceptual diagram for explaining the semiconductor light-emitting diodes of FIGS. 8A to 8E.

FIG. 10 is a flowchart showing a method for self-assembly according to the present disclosure.

FIG. 11 is a conceptual diagram showing a first state of a substrate chuck.

FIG. 12 is a conceptual diagram showing a second state of a substrate chuck.

FIG. 13 is a plan view of a first frame provided at a substrate chuck.

FIG. 14 is a conceptual diagram showing a state in which an assembly substrate is loaded at a substrate chuck.

FIG. 15 is a perspective view of a magnetic field forming part according to one embodiment of the present disclosure.

FIG. 16 is one side view of a magnetic field forming part according to one embodiment of the present disclosure.

FIG. 17 is a lower side view of a magnetic field forming part according to one embodiment of the present disclosure.

FIG. 18 is a conceptual diagram showing a trajectory of magnets provided at the magnetic field forming part according to the present disclosure.

FIG. 19 is a conceptual diagram showing a state in which a semiconductor light-emitting diode is supplied.

FIG. 20 is a plan view of an assembly chamber according to one embodiment of the present disclosure.

FIG. 21 is a cross-sectional view taken along line A-A' of FIG. 20.

FIGS. 22 and 23 are conceptual views showing movement of a gate provided at an assembly chamber according to one embodiment of the present disclosure.

FIG. 24 is a conceptual diagram showing a warpage phenomenon of a substrate generated during self-assembly.

FIG. 25 is a conceptual diagram showing a method for correcting a warpage phenomenon of a substrate.

FIG. 26 is a flowchart showing a method for correcting a warpage phenomenon of a substrate.

FIG. 27 is a partial cross-sectional view of a related art chip tray.

FIG. 28 is a conceptual diagram illustrating an aggregation form of the semiconductor light emitting devices remaining in the chip tray when the semiconductor light emitting devices are repeatedly supplied to an assembly substrate using the chip tray.

FIG. 29 is a conceptual diagram illustrating the structure of a chip tray according to the present invention.

FIG. 30 is a partial cross-sectional view of a chip tray according to the present invention.

FIG. 31 is a conceptual diagram illustrating an aggregation form of the semiconductor light emitting device remaining in the chip tray when the semiconductor light emitting device is repeatedly supplied to an assembly substrate using the chip tray according to the present invention.

FIG. 32 is a conceptual diagram illustrating a state in which a chip alignment unit and a transfer unit are connected.

FIG. 33 is a conceptual diagram illustrating a state in which the tray unit and the transfer unit are connected.

FIGS. 34 and 35 are cross-sectional views of the tray unit and the chip alignment unit.

MODES FOR CARRYING OUT THE INVENTION

Mode for Invention

Hereinafter, the embodiments disclosed in the present specification will be described in detail with reference to the accompanying drawings, but the same or similar components are assigned the same reference numbers regardless of the reference numerals, and overlapping descriptions thereof will be omitted. The suffixes "module" and "part" for the components used in the following description are given or mixed in consideration of only the ease of writing the specification, and do not have distinct meanings or roles by themselves. In addition, in describing the embodiments disclosed in the present specification, if it is determined that detailed descriptions of related known technologies may obscure the gist of the embodiments disclosed in the present specification, the detailed description thereof will be omitted. In addition, it should be noted that the accompanying drawings are only for easy understanding of the embodiments disclosed in the present specification, and should not be construed as limiting the technical spirit disclosed in the present specification by the accompanying drawings.

Also, it will be understood that when an element, such as a layer, area or substrate is referred to as being "disposed on" another element, the element can be disposed directly on another element or there are no intervening elements present.

Mobile terminals described herein can include cellular phones, smart phones, laptop computers, digital broadcasting terminals, personal digital assistants (PDAs), portable multimedia players (PMPs), navigators, slate PCs, tablet PC, ultra-books, digital TVs, digital signage, head-mounted displays (HMDs), desk top computers and the like. However, it can be easily understood by those skilled in the art that the configuration according to the example embodiments of this specification can also be applied to any device capable of displaying information even though such device is a new type of product to be developed.

FIG. 1 is a conceptual diagram showing one embodiment of a display device using semiconductor light-emitting diodes according to the present disclosure. FIG. 2 is a partial enlarged view of the portion A in the display device of FIG. 1. FIG. 3 is an enlarged view of the semiconductor light-emitting diodes of FIG. 2. FIG. 4 is an enlarged view showing another embodiment of the semiconductor light-emitting diodes of FIG. 2.

According to the illustration, information processed by a controller of a display device 100 can be outputted by a display module 140. A closed loop-shaped case 101 that runs around the edge of the display module can form the bezel of the display device.

The display module 140 comes with a panel 141 that displays an image, and the panel 141 can come with micro-sized semiconductor light-emitting diodes 150 and a wiring substrate 110 where the semiconductor light-emitting diodes 150 are mounted.

The wiring substrate 110 can be formed with wiring lines, which can be connected to n-type electrodes 152 and p-type electrodes 156 of the semiconductor light-emitting diodes 150. As such, the semiconductor light-emitting diodes 150 can be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present disclosure takes micro-LEDs (light-emitting diodes) as an example of the semiconductor light-emitting diodes 150 which convert current into light. The micro-LEDs can be light-emitting diodes that are small in size-less than 100 microns. The semiconductor light-emitting diodes 150 have light-emitting regions of red, green, and blue, and unit pixels can produce light through combinations of these colors. That is, the unit pixels are the smallest units for producing one color. Each unit pixels can contain at least three micro-LEDs.

More specifically, referring to FIG. 3, the semiconductor light-emitting diodes 150 can have a vertical structure.

For example, the semiconductor light-emitting diodes 150 can be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom can be electrically connected to a p electrode of the wiring substrate, and the n-type electrode 152 at the top can be electrically connected to an n electrode above the semiconductor light-emitting diode. One of the biggest advantages of the vertical semiconductor light-emitting diode 150 is that the chip size can be reduced by vertically aligning electrodes.

In another example, referring to FIG. 4, the semiconductor light-emitting diodes can be flip chip-type light-emitting diodes.

As an example of such a flip chip-type light-emitting diode, the semiconductor light-emitting diode 150' comprises a p-type electrode 156', a p-type semiconductor layer 155' formed on the p-type electrode 156', an active layer 154' formed on the p-type semiconductor layer 155', an n-type semiconductor layer 153' formed on the active layer 154', and an n-type electrode 152' vertically separated from the p-type electrode 156', on the n-type semiconductor layer 153'. In this case, both the p-type electrode 156' and the n-type electrode 152' can be electrically connected to a p electrode and n electrode of the wiring substrate, below the semiconductor light-emitting diode.

The vertical semiconductor light-emitting diode and a horizontal light-emitting diode each can be used as a green semiconductor light-emitting diode, blue semiconductor light-emitting diode, or red semiconductor light-emitting diode. The green semiconductor light-emitting diode and the blue semiconductor light-emitting diode can be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes can be composed of gallium nitride thin films which are formed of various layers of n-Gan, p-GaN, AlGaN, InGaN, etc. More specifically, the p-type semiconductor layer can be P-type GaN, and the n-type semiconductor layer can be N-type GaN.

Moreover, the p-type semiconductor layer can be P-type GaN doped with Mg on the p electrode, and the n-type semiconductor layer can be N-type GaN doped with Si on the n electrode. In this case, the above-described semiconductor light-emitting diodes can come without the active layer.

Meanwhile, referring to FIGS. 1 to 4, because of the very small size of the light-emitting diodes, self-emissive, high-definition unit pixels can be arranged on the display panel, and therefore the display device can deliver high picture quality.

In the above-described display device using semiconductor light-emitting diodes according to the present disclosure, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes can be transferred at a time by using a stamp or roll, which, however, is not suitable for large-screen displays because of limited yields. The present disclosure suggests a new method and device for manufacturing a display device that can improve on these problems.

To this end, the new method for manufacturing a display device will be described first below: FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes or other electrical devices. Also, although the illustration will be given of how horizontal semiconductor light-emitting diodes are self-assembled, it also can apply to self-assembling of vertical semiconductor light-emitting diodes and other electrical devices.

First of all, according to the manufacturing method, a first conductive semiconductor layer 153, an active layer 154, and a second conductive semiconductor layer 155 are grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 can be a p-type semiconductor layer, and the second conductive semiconductor layer 155 can be an n-type semiconductor layer. However, the present disclosure is not necessarily limited to this, and the first conductive type can be n-type and the second conductive type can be p-type.

Moreover, although this example embodiment is illustrated by assuming the presence of the active layer, the active layer can be omitted if necessary or desired, as stated above. In an example, the p-type semiconductor layer can be P-type GaN doped with Mg, and the n-type semiconductor layer can be N-type GaN doped with Si on the n electrode.

The growth substrate 159 (wafer) may be formed of a material having a light-transmitting property, for example, any one of sapphire (Al$_2$O$_3$), GaN, ZnO, and AlO, but is not limited thereto. In addition, the growth substrate 1059 may be formed of a material suitable for semiconductor material growth, a carrier wafer. It can be formed of a material having excellent thermal conductivity, and for example, a SiC substrate or Si, GaAs, GaP, InP, Ga2O3, which has higher thermal conductivity than a sapphire (Al$_2$O$_3$) substrate, including a conductive substrate or an insulating substrate, at least one of Si, GaAs, GaP, InP, Ga2O3 can be used Next, a plurality of semiconductor light-emitting diodes are formed by removing at least part of the first conductive semiconductor layer 153, active layer 154, and second conductive semiconductor layer 155 (see FIG. 5B).

More specifically, isolation is performed so that the light-emitting diodes form a light-emitting diode array. That is, a plurality of semiconductor light-emitting diodes are formed by vertically etching the first conductive semiconductor layer 153, active layer 154, and second conductive semiconductor layer 155, for example.

In the case of horizontal semiconductor light-emitting diodes, a mesa process can be performed which exposes the first conductive semiconductor layer 153 to the outside by vertically removing part of the active layer 154 and second conductive layer 155, and then isolation can be performed which forms an array of semiconductor light-emitting diodes by etching the first conductive semiconductor layer 153.

Next, a second conductive electrode 156 (or p-type electrode) is formed on one surface of the second conductive semiconductor layer 155 (see FIG. 5C). The second conductive electrode 156 can be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 can serve as an n-type electrode.

Next, the growth substrate 159 is removed, thus leaving a plurality of semiconductor light-emitting diodes. For example, the growth substrate 159 can be removed using laser lift-off (LLO) or chemical lift-off (CLO) (see FIG. 5D).

Afterwards, the step of mounting the semiconductor light-emitting didoes 150 on a substrate in a chamber filled with a fluid is performed (see FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate can be an assembly substrate 161.

In another example, a wiring substrate, instead of the assembly substrate 161, can be put into an assembly chamber, and the semiconductor light-emitting diodes 150 can be mounted directly onto the wiring substrate. In this case, the substrate can be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells into which the semiconductor light-emitting diodes 150 are fitted can be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes can be transferred to the wiring substrate from the assembly substrate 161, thereby enabling a large-area transfer across a large area. Thus, the assembly substrate 161 can be referred to as a temporary substrate.

Meanwhile, the above-described self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

FIG. 6 is a conceptual diagram showing an example of a device for self-assembling semiconductor light-emitting diodes according to the present disclosure. FIG. 7 is a block diagram of the self-assembly device of FIG. 6. FIGS. 8A to 8E are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8E.

Referring to FIGS. 6 and 7, the self-assembly device 160 of the present disclosure can comprise an assembly chamber 162, magnets 163, and a position controller 164.

The assembly chamber 162 is equipped with space for a plurality of semiconductor light-emitting diodes. The space can be filled with a fluid, and the fluid can be an assembly solution, which includes water or the like. Thus, the assembly chamber 162 can be a water tank and configured as open-type. However, the present disclosure is not limited to this, and the assembly chamber 162 can be a closed-type chamber that comes with a closed space.

A substrate 161 can be placed in the assembly chamber 162 so that an assembly surface where the semiconductor light-emitting diodes 150 are assembled facing downwards. For example, the substrate 161 is fed to an assembly site by a feed unit, and the feed unit can come with a stage 165 where the substrate is mounted. The position of the stage 165 can be adjusted by the controller, whereby the substrate 161 can be fed to the assembly site.

In this instance, the assembly surface of the substrate 161 at the assembly site faces the bottom of the assembly chamber 162. As shown in the drawings, the assembly surface of the substrate 161 is placed in such a way as to be soaked with the fluid in the assembly chamber 162. Thus, the semiconductor light-emitting diodes 150 in the fluid are moved to the assembly surface.

The substrate 161 is an assembly substrate where an electric field can be formed, and can comprise a base portion 161a, a dielectric layer 161b, and a plurality of electrodes 161c.

The base portion 161a is made of insulating material, and the electrodes 161c can be thin-film or thick-film bi-planar electrodes that are patterned on one surface of the base portion 161a. The electrodes 161c can be formed of a stack of Ti/Cu/Ti, Ag paste, ITO, etc.

The dielectric layer 161b can be made of inorganic material such as $SiO_2$, SiNx, SiON, $Al_2O_3$, $TiO_2$, $HfO_2$, etc. Alternatively, the dielectric layer 161b can be an organic insulator and composed of a single layer or multi-layers. The thickness of the dielectric layer 161b can range from several tens of nm to several μm.

Further, the substrate 161 according to the present disclosure comprises a plurality of cells 161d that are separated by partition walls 161e. The cells 161d can be sequentially arranged in one direction and made of polymer material. Also, the partition walls 161e forming the cells 161d can be shared with neighboring cells 161d. The partition walls 161e can protrude from the base portion 161a, and the cells 161d can be sequentially arranged in one direction along the partition walls 161e. More specifically, the cells 161d can be sequentially arranged in column and row directions and have a matrix structure.

As shown in the drawings, the cells 161d can have recesses for accommodating the semiconductor light-emitting diodes 150, and the recesses can be spaces defined by the partition walls 161e. The recesses can have a shape identical or similar to the shape of the semiconductor light-emitting diodes. For example, if the semiconductor light-emitting diodes are rectangular, the recesses can be rectangular too. Moreover, the recesses formed in the cells can be circular if the semiconductor light-emitting diodes are circular. Further, each cell is configured to accommodate one semiconductor light-emitting diode. That is, one cell accommodates one semiconductor light-emitting diode.

Meanwhile, the plurality of electrodes 161c have a plurality of electrode lines that are placed at the bottom of the cells 161d, and the electrode lines can be configured to extend to neighboring cells.

The electrodes 161c are placed on the undersides of the cells 161d, and different polarities can be applied to create an electric field within the cells 161d. To form an electric field, the dielectric layer 161b can form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device can have magnets 163 for applying magnetic force to the semiconductor light-emitting diodes. The magnets 163 are placed at a distance from the assembly chamber 162 and apply a magnetic force to the semiconductor light-emitting diodes 150. The magnets 163 can be placed to face the opposite side of the assembly surface of the substrate 161, and the positions of the magnets 163 are controlled by the position controller 164 connected to the magnets 163.

The semiconductor light-emitting diodes 1050 can have a magnetic material so that they are moved within the fluid by a magnetic field.

Referring to FIG. 9, in a semiconductor light emitting device including a magnetic material, a first conductivity type electrode 1052, a second conductivity type electrode 1056, and a first conductivity type semiconductor layer in which the first conductivity type electrode 1052 are disposed (1053), a second conductivity type semiconductor layer 1055 overlapping the first conductivity type semiconductor layer 1052 and on which the second conductivity type electrode 1056 is disposed, and the first and second conductivity type semiconductors an active layer 1054 disposed between the layers 1053 and 1055.

Here, the first conductive type can refer to p-type, and the second conductive type can refer to n-type, or vice versa. As stated previously, the semiconductor light-emitting diode can be formed without the active layer.

Meanwhile, in the present disclosure, the first conductive electrode 1052 can be formed after the semiconductor light-emitting diode is assembled onto the wiring substrate by the self-assembling of the semiconductor light-emitting diode. Further, in the present disclosure, the second conductive electrode 1056 can comprise a magnetic material. The magnetic material can refer a magnetic metal. The magnetic material can be Ni, SmCo, etc. In another example, the magnetic material can include at least one among Gd-based, La-based, and Mn-based materials.

The magnetic material can be provided in the form of particles on the second conductive electrode 1056. Alternatively, one layer of a conductive electrode comprising a magnetic material can be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a can comprise a magnetic material, and the second layer 1056b can comprise a metal material other than the magnetic material.

As shown in the drawing, in this example, the first layer 1056a comprising the magnetic material can be placed in contact with the second conductive semiconductor layer 1055. In this case, the first layer 1056a is placed between the second layer 1056b and the second conductive semiconductor layer 1055. The second layer 1056b can be a contact metal that is connected to the wiring electrode on the wiring substrate. However, the present disclosure is not necessarily limited to this, and the magnetic material can be placed on one surface of the first conductive semiconductor layer.

Referring again to FIGS. 6 and 7, more specifically, on top of the assembly chamber of the self-assembly device, a magnet handler (or magnetic handler) capable of automatically or manually moving the magnets 163 on the x, y, and z axes or a motor capable of rotating the magnets 163 can be provided. The magnet handler and motor can constitute the position controller 164. As such, the magnets 163 can rotate in a horizontal, clockwise, or counterclockwise direction to the substrate 161.

Meanwhile, the assembly chamber 162 can be formed with a light-transmissive bottom plate 166, and the semiconductor light-emitting diodes can be placed between the bottom plate 166 and the substrate 161. An image sensor 167 can be placed opposite to the bottom plate 166 so as to monitor the inside of the assembly chamber 162 through the bottom plate 166. The image sensor 167 can be controlled by a controller 172, and can come with an inverted-type lens, CCD, etc. so as to observe the assembly surface of the substrate 161.

The above-described self-assembly device is configured to use a magnetic field and an electric field in combination. With this, the semiconductor light-emitting diodes are mounted at preset positions on the substrate by an electric field while in the process of being moved by changes in the positions of the magnets. Below; the assembly process using the above-described self-assembly device will be described in more details.

First of all, a plurality of semiconductor light-emitting diodes 1050 having a magnetic material can be formed through the process explained with reference to FIGS. 5A to 5C. In this case, the magnetic material can be deposited onto the semiconductor light-emitting didoes in the process of forming the second conductive electrode of FIG. 5C.

Next, the substrate 161 is fed to an assembly site, and the semiconductor light-emitting diodes 1050 are put into the assembly chamber 162 (see FIG. 8A).

As described above, the assembly site on the substrate 161 can be a position at which the substrate 161 is placed in the assembly chamber 162 in such a way that an assembly surface where the semiconductor light-emitting diodes 150 are assembled faces downwards.

In this case, some of the semiconductor light-emitting diodes 1050 can sink to the bottom of the assembly chamber 162 and some of them can float in the fluid. If the assembly chamber 162 comes with a light-transmissive bottom plate 166, some of the semiconductor light-emitting diodes 1050 can sink to the bottom plate 166.

Next, a magnetic force is applied to the semiconductor light-emitting diodes 1050 so that the semiconductor light-emitting diodes 1050 in the assembly chamber 162 come up to the surface (see FIG. 8B).

When the magnets 163 of the self-assembly device move to the opposite side of the assembly surface of the substrate 161 from their original positions, the semiconductor light-emitting diodes 1050 float in the fluid towards the substrate 161. The original positions can refer to positions at which the magnets 163 are outside the assembly chamber 162. In another example, the magnets 163 can be composed of electromagnets. In this case, an initial magnetic force is generated by supplying electricity to the electromagnets.

Meanwhile, in this embodiment, the assembly surface of the substrate 161 and the spacing between the semiconductor light-emitting diodes 1050 can be controlled by adjusting the strength of the magnetic force. For example, the spacing is controlled by using the weight, buoyancy, and magnetic force of or applied to the semiconductor light-emitting diodes 1050. The spacing can be several millimeters to several tens of micrometers from the outermost part of the substrate 161.

Next, a magnetic force is applied to the semiconductor light-emitting diodes 1050 so that the semiconductor light-emitting diodes 1050 move in one direction within the assembly chamber 162. For example, the magnets 163 can move in a horizontal, clockwise, or counterclockwise direction to the substrate 161 (see FIG. 8C). In this case, the semiconductor light-emitting diodes 1050 are moved horizontally to the substrate 161 by the magnetic force, spaced apart from the substrate 161.

Next, the semiconductor light-emitting diodes 1050 are guided to preset positions on the substrate 161 by applying an electric field so that the semiconductor light-emitting diodes 1050 are mounted at the preset positions while in the process of being moved (see FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 can be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes can be transferred onto a wiring substrate to carry out a subsequent process for realizing the display device, as described previously.

Meanwhile, after the semiconductor light-emitting diodes 1050 are guided to the preset positions, the magnets 163 can be moved in a direction in which they get farther away from the substrate 161, so that the semiconductor light-emitting diodes 1050 remaining in the assembly chamber 162 fall to the bottom of the assembly chamber 162 (see FIG. 8D). In another example, if power supply is stopped in a case where the magnets 163 are electromagnets, the semiconductor light-emitting diodes 1050 remaining in the assembly chamber 162 fall to the bottom of the assembly chamber 162.

Thereafter, the semiconductor light-emitting diodes 1050 on the bottom of the assembly chamber 162 can be collected, and the collected semiconductor light-emitting diodes 1050 can be re-used.

In the above-described self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects.

As seen from above, with the above configuration according to the present disclosure, large numbers of semiconductor light-emitting diodes can be assembled at a time on a display device where individual pixels are made up of semiconductor light-emitting diodes.

As such, according to the present disclosure, large numbers of semiconductor light-emitting diodes can be pixelated on a small-sized wafer and then transferred onto a large-area substrate. This enables the manufacture of a large-area display device at a low cost.

When the self-assembly process described above is performed, several problems occur.

Firstly, as an area of the display increases, an area of the assembly substrate increases. As the area of the assembly substrate increases, there is a problem that a warpage phenomenon of the substrate increases. When a self-assembly is performed in a state in which the assembly substrate is warped, since the magnetic field at the surface of the assembly substrate is not uniformly formed or applied, it is difficult to perform the self-assembly stably.

Secondly, since the semiconductor light-emitting diodes may not be completely uniformly dispersed in the fluid and the magnetic field formed at the surface of the assembly substrate may not be uniform completely, a problem that the semiconductor light-emitting diodes are concentrated only at a partial region of the assembly substrate can occur.

The present disclosure provides a self-assembly device capable of solving the above-described problems and increasing a self-assembly yield.

The self-assembly device according to the present disclosure can include a substrate surface treatment part, a substrate chuck 200, a magnetic field forming part 300, a chip supply part 400, and an assembly chamber 500. However, the present disclosure is not limited thereto, and the self-assembly device according to the present disclosure can include more or less components than those described above.

The self-assembly apparatus according to the present invention may include a substrate surface treatment unit, a substrate chuck 200, a magnetic field forming unit 300, a chip supply unit 400, and an assembly chamber 500. However, the present invention is not limited thereto, and the self-assembly apparatus according to the present invention may include more or fewer components than the above-described components.

Prior to describing the self-assembly device according to the present disclosure, a method for self-assembly using the self-assembly device according to the present disclosure will be described briefly.

FIG. 10 is a flowchart showing a method for self-assembly according to the present disclosure.

First, a surface treatment step S110 of an assembly substrate is performed. The step is not essential, but when a surface of the substrate is hydrophilized, it is possible to prevent bubbles from being generated on the surface of the substrate.

Next, a step S120 of loading the assembly substrate onto the substrate chuck is performed. The assembly substrate loaded on the substrate chuck 200 is transferred to an assembly position of the assembly chamber. Thereafter, the magnetic field forming part approaches the assembly substrate through vertical and horizontal movements.

In such a state, a step S130 of supplying a chip is performed. Specifically, a step of dispersing the semiconductor light-emitting diode on the assembly surface of the assembly substrate is performed. When the semiconductor light-emitting diode is dispersed near the assembly surface in a state in which the magnetic field forming part 300 is close enough to the assembly substrate, the semiconductor light-emitting diodes adhere to the assembly surface by the magnetic field forming part. The semiconductor light-emitting diodes are dispersed onto the assembly surface at an appropriate dispersion.

However, the present disclosure is not limited thereto, and the semiconductor light-emitting diode can be dispersed into the fluid in the assembly chamber before the substrate is transferred to the assembly position. That is, a time point at which the chip supply step S130 is performed is not limited to after the assembly substrate is transferred to the assembly position.

A method of supplying the semiconductor light-emitting diode can vary according to an area of the assembly substrate, a type of the semiconductor light-emitting diode to be assembled, and a self-assembly speed.

Thereafter, a step S140 of performing the self-assembly and collecting the semiconductor light-emitting diode is performed. The self-assembly will be described later together with a description of a self-assembly device according to the present disclosure. Meanwhile, the semiconductor light-emitting diode is not necessarily collected after the self-assembly. After the self-assembly is completed, the semiconductor light-emitting diode in the assembly chamber is replenished, and then a new substrate can be used to self-assemble the semiconductor light-emitting diode.

Lastly, after the self-assembly is completed, a step S150 of inspecting and drying the assembly substrate, and separating the substrate from the substrate chuck can be performed. The inspection of the assembly substrate can be performed at the position in which the self-assembly has been performed, and can be performed after the assembly substrate is transferred to another position.

Meanwhile, the drying of the assembly substrate can be performed after the assembly substrate is separated from the fluid. After the drying of the assembly substrate, a post process of the self-assembly can be performed.

Contents of a basic principle of the self-assembly, a structure of the substrate (or assembly substrate), and the semiconductor light-emitting diode are replaced with those described in FIGS. 1 to 9. Meanwhile, since a vertical moving part, a horizontal moving part, a rotating part, and other moving means described below can be implemented through several known means such as a motor and a ball screw; a rack gear and a pinion gear, and a pulley and a timing belt, and the like, detailed descriptions thereof will be omitted.

Meanwhile, the controller 172 described in FIG. 7 controls movements of the vertical moving part, the horizontal moving part, the rotating part, and other moving means provided in the above-described components. That is, the controller 172 is configured to control movements of x, y, and z axes and a rotating movement of each component. Even though not mentioned separately in the specification, the movements of the vertical moving part, the horizontal moving part, the rotating part, and other moving means are generated by the control of the controller 172.

Meanwhile, the electrode 161c provided at the substrate (or assembly substrate 161) described in FIGS. 6 to 9 is referred to as an assembly electrode, the assembly electrode 161c is electrically connected to the power supply 171 described in FIG. 7 via the substrate chuck 200, and the power supply 171 supplies power to the assembly electrode 161c by the control of the controller 172. Detailed description thereof will be described later.

Hereinafter, the above-described components will be described.

First, a substrate surface treatment part serves to hydrophilize a substrate surface. Specifically, the self-assembly device according to the present disclosure performs a self-assembly in a state in which the assembly substrate is in contact with a fluid surface. When the assembly surface of the assembly substrate has a heterogeneous property with the fluid surface, bubbles and the like can occur at the assembly surface, and non-specific coupling between the semiconductor light-emitting diode and the assembly surface can occur. To prevent this, the substrate surface can be treated with fluid-friendly properties before the self-assembly.

In one embodiment, when the fluid is a polar material such as water, the substrate surface treatment part can hydrophilize the assembly surface of the substrate.

For example, the substrate surface treatment part can include a plasma generator. Hydrophilic functional groups can be formed at the substrate surface by plasma treatment of the substrate surface. Specifically, the hydrophilic functional groups can be formed at at least one of a partition wall and a dielectric layer provided at the substrate by the plasma treatment.

Meanwhile, different surface treatments can be performed at a partition wall surface and a surface of the dielectric layer exposed to the outside by a cell so as to prevent non-specific coupling of the semiconductor light-emitting diode. For example, a hydrophilic treatment can be performed at the surface of the dielectric layer exposed to the outside by the cell, and a surface treatment can be performed to form hydrophobic functional groups at the surface of the partition wall. Accordingly, non-specific coupling of the semiconductor light-emitting diode with respect to the surface of the partition wall can be prevented, and the semiconductor light-emitting diode can be strongly fixed inside the cell.

However, the substrate surface treatment part is not an essential component in the self-assembly device according to the present disclosure. The substrate surface treatment part need not be necessary depending on a material configuring the substrate.

The substrate at which the surface treatment is completed by the substrate surface treatment part is loaded onto a substrate chuck 200.

Next, the substrate chuck 200 will be described.

FIG. 11 is a conceptual diagram showing a first state of a substrate chuck, FIG. 12 is a conceptual diagram showing a second state of the substrate chuck, FIG. 13 is a plan view of a first frame provided at the substrate chuck, and FIG. 14 is a conceptual diagram showing a state in which an assembly substrate is loaded at the substrate chuck.

Referring to the accompanying drawings, the substrate chuck 200 includes a substrate support part 205. In one embodiment, the substrate support part 205 can include first and second frames 210 and 220 and a fixing part 230. The first and second frames 210 and 220 are disposed at upper and lower sides of the loaded substrate interposed therebetween, and the fixing part 230) supports the first and second frames 210 and 220. The substrate chuck 200 can include all of a rotating part 240), a vertical moving part, and a horizontal moving part 250. As shown in FIG. 11, the vertical moving part and the horizontal moving part 250) can be formed as one device as a moving part 250, but such is not required, and the vertical moving part and the horizontal moving part can be formed separately. Meanwhile, the present disclosure is not limited to drawings described below; and the rotating part, the vertical and horizontal moving parts provided at the substrate chuck can be formed as one device.

In the present specification, the first frame 210 is defined as a frame disposed at a lower side of the substrate in a state in which the assembly surface of the substrate S faces a fluid, and the second frame 220 is defined as a frame disposed at an upper side of the substrate in a state in which the assembly surface of the substrate faces the fluid. The upper and lower sides relation between the first frame 210 and the second frame 220 can be switched with each other due to the rotating part 240. In the present specification, a state in which the first frame 210 is under the second frame 220 is defined as a first state (see FIG. 11), and a state in which the first frame 210 is over the second frame 220 is defined as a second state (see FIG. 12). The rotating part 240 rotates at least one of the first and second frames 210 and 220 and the fixing part 230 to switch from any one of the first and second states to the other. The rotating part 240 will be described later.

The first frame 210 is a frame in contact with the fluid filled in the assembly chamber during self-assembly. Referring to FIG. 14, the first frame 210 includes a bottom portion 210' and a sidewall portion 210".

The bottom portion 210' serves to support the substrate at the lower side or the upper side of the substrate S when the substrate S is loaded. The bottom portion 210' can be formed in one plate shape, or can be formed in a form in which a plurality of members forming a plate shape are coupled to each other. Referring to FIG. 13, the bottom portion 210' includes a hole 210' passing through a central portion. The hole 210''' can expose a substrate (which will be described later) to the outside to be in contact with the fluid. That is, the hole 210" defines the assembly surface of the substrate. The substrate is loaded such that four corners of the rectangular substrate are mounted on an edge of the hole 210" of the first frame 210. Accordingly, a remaining region except the edge of the substrate is overlapped with the hole 210''' provided at the first frame 210. The region of the substrate overlapped with the hole 210" becomes an assembly surface.

Meanwhile, a sealing part 212 and an electrode connection part 213 may be disposed on the edge of the hole 210'''.

The sealing part 212 is in close contact with the substrate to prevent the fluid filled in the assembly chamber from penetrating into the first and second frames 210 and 220 during self-assembly. In addition, the sealing part 212 prevents the fluid from penetrating into the assembly electrode 161c and the electrode connection part 213. For this, the sealing part 212 should be disposed at a position closer to the hole 210' than the electrode connection part 213.

The sealing part 212 is formed in a ring shape, and a material of the sealing part 212 is not particularly limited. The material forming the sealing part 212 can be a known sealing material.

The electrode connection part 213 is connected to the assembly electrode formed at the substrate to supply a power to the assembly electrode. In one embodiment, the electrode connection part 213 can apply a power supplied from the power supply 171 described in FIG. 7 to the assembly electrode 161c to form an electric field on the substrate.

Meanwhile, the side wall portion 210 "is formed on the edge of the bottom portion 210'. The side wall portion 210" prevents fluid from penetrating into the opposite surface of the assembly surface of the substrate during self-assembly. Specifically, the self-assembly apparatus according to the present invention performs self-assembly in a state in which the substrate is immersed in a fluid. The side wall portion 210 "prevents the fluid from penetrating into the opposite surface of the assembly surface of the substrate when the substrate is immersed in the fluid.

For this, the sidewall portion 210" is formed to surround an entire edge of the substrate. A height of the sidewall portion 210" should be greater than a depth at which the substrate is submerged in the fluid. The sidewall portion 210" prevents the fluid from penetrating into the opposite surface of the assembly surface of the substrate, and thus the substrate is prevented from being damaged, and buoyancy of the fluid is applied to only one surface of the substrate. This will be described later.

Meanwhile, the second frame 220 serves to press the substrate at the opposite side of the first frame 210 during self-assembly. Like the first frame 210, the second frame 220 includes a hole passing through a central portion. The hole formed at the second frame 220 is formed to have a size equal to or larger than the hole 210" formed at the first frame 210.

The hole formed at the second frame 220 allows the opposite surface of the assembly surface of the substrate to be exposed to the outside. The opposite surface of the assembly surface of the substrate should be exposed to the outside in the same area as the assembly surface or in a larger area than the assembly surface. This is because the magnetic field forming part 300 forms a magnetic field at the opposite side of the assembly surface of the substrate. The opposite surface of the assembly surface of the substrate should be exposed to the outside such that the magnetic field forming part 300 can sufficiently approach the substrate.

Meanwhile, the substrate S is loaded between the first and second frames 210 and 220 in the second state. Accordingly, the substrate S is slid and loaded at one surface of the second frame 220. A protrusion for guiding an alignment position of the substrate can be formed at at least one of the first and second frames such that the substrate is aligned to a correct position. In one embodiment, referring to FIG. 13, a protrusion 211 guiding the alignment position of the substrate S can be formed at the first frame 210.

Meanwhile, when the substrate S is loaded on the second frame 220, at least one of the first and second frames 210 and 220 moves vertically such that the first and second frames 210 and 220 press the substrate. For this, the substrate chuck 200 can include a frame moving part disposed at at least one of the fixing part 230, and the first and the second frames 210 and 220. At this time, the sealing part 212 presses the substrate S.

In one embodiment, a frame moving part for vertically moving the second frame 220 can be disposed at the fixing part 230. While the substrate chuck is in the second state, when the substrate S is loaded on the second frame 220, the vertical moving part moves the second frame 220) upwardly such that the substrate S can be strongly fixed between the first and second frames 210 and 220. At this time, the electrode connection part 213 provided at the first frame 210 is connected to the assembly electrode of the substrate S, and the sealing part 212 provided at the first frame 210 presses the edge of the substrate S. In this state, when the substrate chuck switches to the first state, the substrate chuck has a shape as shown in FIG. 14.

However, the present disclosure is not limited thereto, and the frame moving part can be formed so as to move any one of the first and second frames 210 and 220 horizontally with respect to the other. In this case, the frame moving part is formed so as to move any one of the first and second frames 210 and 220 vertically and horizontally with respect to the other. When any one of the first and second frames 210 and 220 can be moved horizontally with respect to the other, a connection part between the electrode connection part 213 and the assembly electrode can be changed. It can be used to detect whether the assembled electrode is defective.

Meanwhile, the rotating part 240) is disposed at one side of the fixing part 230 provided at the substrate chuck 200 described above. The rotating part 240 rotates the fixing part 230 such that the upper and lower-sides relation of the first and second frames 210 and 220 can be switched to each other. The substrate chuck 200 is switched from any one of the first and second states to the other by rotating movement of the rotating part 240. A rotation speed, a degree of rotation, a rotation direction, and the like of the rotating part 240) can be controlled by the controller 172 described in FIG. 7.

In one embodiment, the substrate chuck 200 is in the second state before the substrate S is loaded, and the controller 172 controls the rotating part 240 to rotate the fixing part 230 to 180 degrees after the substrate S is loaded such that the substrate chuck 200 is switched to the first state.

Meanwhile, a vertical moving part and a horizontal moving part are disposed at one side of the fixing part 230.

The horizontal moving part moves at least one of the fixing part 230, and the first and second frames 210 and 220 such that the assembly surface of the substrate can be aligned at an open position of the assembly chamber after the substrate is loaded.

The vertical moving part moves at least one of the fixing part 230, and the first and second frames 210 and 220 such that the vertical distance between the substrate and the assembly chamber is adjusted. A warpage phenomenon of the substrate S can be corrected by the vertical moving part. This will be described later.

In summary, the substrate S is loaded in the second state of the substrate chuck 200 (see FIG. 12). Thereafter, the substrate chuck 200 is switched to the first state (see FIG. 11) and then aligned with the assembly chamber. In this process, the substrate chuck 200 moves vertically and horizontally such that the assembly surface of the substrate S is in contact with the fluid filled in the assembly chamber. Thereafter, the controller 172 controls the magnetic field forming part 300.

Next, the magnetic field forming part 300 will be described.

FIG. 15 is a perspective view of a magnetic field forming part according to one embodiment of the present disclosure, FIG. 16 is one side view of a magnetic field forming part according to one embodiment of the present disclosure, FIG. 17 is a bottom side view of a magnetic field forming part according to one embodiment of the present disclosure, and FIG. 18 is a conceptual diagram showing a trajectory of magnets provided at a magnetic field forming part according to the present disclosure.

Referring to the drawings, the magnetic field forming part 300 includes a magnet array 310, a vertical moving part 320, a horizontal moving part 320, and a rotating part 320. The magnetic field forming part 300 is disposed at an upper side of the assembly electrode to serve to form a magnetic field.

Specifically, the magnet array 310 includes a plurality of magnets 313. Each magnet 313 provided at the magnet array 310 can be a permanent magnet or an electromagnet. The magnets 313 serves to form a magnetic field so that the semiconductor light-emitting diodes are led to the assembly surface of the substrate.

The magnet array 310 can include a support part 311 and a magnet moving part 312. The support part 311 is connected to vertical, horizontal moving part parts 320.

Meanwhile, one end of the magnet moving part 312 is fixed to the support part 311, and the magnet 313 is fixed to the other end of the magnet moving part 312. The magnet moving part 312 is formed to be stretchable in length, and as the magnet moving part 312 is stretched, a distance between the magnet 313 and the support part 311 changes.

As shown in the accompanying drawings, the magnet moving part 312 can be configured to vertically move the magnets 313 disposed in one row at a time. In this case, the magnet moving part 312 can be disposed for each column of the magnet array.

On the other hand, the magnet moving part 312 can be disposed by the number of magnets provided in the magnet array. Accordingly, a distance between each of a plurality of magnets and the support part can be adjusted differently.

The plurality of magnet moving parts serves to adjust finely a gap between the magnet 313 and the substrate S, and when the substrate is warped, serves to adjust uniformly the gaps between the magnets 313 and the substrate S. Self-assembly can be performed in a state in which the magnet 313 is in contact with the substrate S, or can be performed in a state in which the magnet 313 is spaced apart from the substrate S at a predetermined distance.

Meanwhile, the horizontal moving part can include a rotating part. When the self-assembly is performed, the horizontal moving part provided at the magnetic field forming part 300 moves the magnet in one direction and rotates the magnet, simultaneously. Accordingly, the magnet array 310 rotates with respect to a predetermined rotation axis and moves along one direction, simultaneously. For example, referring to FIG. 18, the magnet 313 provided at the magnet array 310 can move while drawing a trajectory P mixed with a curved line and a straight line.

The semiconductor light-emitting diode can be supplied in a state in which the magnetic field forming part 300 is close to the substrate S within a predetermined distance.

FIG. 19 is a conceptual diagram showing a state in which a semiconductor light-emitting diode is supplied.

Referring to FIG. 19, a chip supply part 400 can be disposed in an assembly chamber 500 to be described later. The substrate S is aligned with the assembly chamber 500, and then the chip supply part 400 serves to supply the semiconductor light-emitting diode to the assembly surface of the substrate S. Specifically, the chip supply part 400 can include a chip accommodating part that can accommodate a chip at an upper portion thereof, a vertical moving part, and a horizontal moving part. The vertical and horizontal moving parts allow the chip accommodating part to move in the fluid filled in the assembly chamber.

A plurality of semiconductor light emitting devices may be loaded in the chip accommodating part. After the substrate is aligned with the assembly chamber, when the magnetic field forming unit 300 is brought closer to the substrate by a predetermined distance or more, a magnetic field of a predetermined strength or more is formed on the assembly surface. When the chip accommodating part approaches the assembly surface within a predetermined distance in this state, the semiconductor light emitting devices loaded in the chip accommodating part come into contact with the substrate. The vertical moving unit provided in the chip supply unit moves the chip receiving unit close to a partial region of the assembly surface of the substrate within a predetermined distance through vertical movement.

After a predetermined time passes, the vertical moving part provided at the chip supply part allows the chip accommodating part to be separated from the partial region of the assembly surface of the substrate at the predetermined distance or longer through vertical movement. Thereafter, the horizontal moving part provided at the chip supply part moves horizontally the chip accommodating part such that the chip accommodating part is overlapped with a different region from the partial region of the assembly surface. Thereafter, the vertical moving part provided at the chip supply part brings the chip accommodating part close to the different region within the predetermined distance through vertical movement. By repeating such a process, the chip supply part brings the plurality of semiconductor light-emitting diodes into contact with an entire region of the assembly surface of the substrate. Self-assembly can be performed in a state in which the plurality of semiconductor light-emitting diodes are constantly dispersed and in contact with the entire region of the assembly surface of the substrate.

As described above, there are largely two problems in self-assembly. A second problem is that since the semiconductor light-emitting diodes need not be completely uniformly dispersed in the fluid and the magnetic field formed at the surface of the assembly substrate need not be perfectly uniform, there is a problem that the semiconductor light-emitting diodes are concentrated only at a partial region of the assembly substrate. When using the chip supply part 400 described above, it is possible to solve the second problem described above.

However, the present disclosure is not limited thereto, and the chip supply part is not an essential component of the present disclosure. Self-assembly can be performed in a state in which the semiconductor light-emitting diode is dispersed in the fluid, or in a state in which the plurality of semiconductor light-emitting diodes are dispersed and in contact with the assembly surface of the substrate by another part which is not the chip supply part.

Next, the assembly chamber 500 will be described.

FIG. 20 is a plan view of an assembly chamber according to one embodiment of the present disclosure, FIG. 21 is a cross-sectional view taken along line A-A' of FIG. 20, and FIGS. 22 and 23 are conceptual diagrams showing a movement of a gate provided at an assembly chamber according to one embodiment of the present disclosure.

The assembly chamber 500 includes a space for accommodating a plurality of semiconductor light-emitting diodes. The space can be filled with a fluid, and the fluid can include water, and the like as an assembly solution. Therefore, the assembly chamber 500 can be a water tank, and can be configured as an open type. However, the present disclosure is not limited thereto, and the space of the assembly chamber 500 can be a closed type formed in a closed space.

In the assembly chamber 500, a substrate S is disposed such that an assembly surface at which the semiconductor light-emitting diodes 150 are assembled is faced downwardly. For example, the substrate S is transferred to an assembly position by the substrate chuck 200.

At this time, the assembly surface of the substrate S at the assembly position faces a bottom of the assembly chamber 500. Accordingly, the assembly surface is toward a direction of gravity. The assembly surface of the substrate S is disposed to be submerged in the fluid in the assembly chamber 500.

In one embodiment, the assembly chamber 500 can be divided into two regions. Specifically, the assembly chamber 500 can be divided into an assembly region 510 and an inspection region 520. In the assembly region 510, the semiconductor light-emitting diode disposed in the fluid is assembled to the substrate S in a state in which the substrate S is submerged in the fluid.

On the other hand, in the inspection region 520, the substrate S that has been self-assembled is inspected. Specifically, the substrate S is assembled at the assembly region and then transferred to the inspection region via the substrate chuck.

The same fluid can be filled in the assembly region 510 and the inspection region 520. The substrate can be transferred from the assembly region to the inspection region in a state in which the substrate is submerged in the fluid. When the substrate S disposed in the assembly region 510 is taken out of the fluid, the previously assembled semiconductor light-emitting diode can be separated from the substrate due to surface energy between the fluid and the semiconductor light-emitting diode. For this reason, it is preferable but not required that the substrate is transferred in a state of being submerged in the fluid.

The assembly chamber 500 can include a gate 530 configured to be capable of moving up and down such that the substrate can be transferred in a state of being submerged in the fluid. As shown in FIG. 22, the gate 530 maintains an elevated state (first state) during self-assembly or during substrate inspection, so that the fluid accommodated in the assembly region 510 and the inspection region 520 of the assembly chamber 500 is separated from each other. The gate 530 separates the assembly region and the inspection region, thereby preventing disturbing the inspection of the substrate due to moving of the semiconductor light-emitting diode to the inspection region during self-assembly.

As shown in FIG. 23, when the substrate S is transferred, the gate 530 moves down (second state) to remove a boundary between the assembly region 510 and the inspection region 520. Accordingly, the substrate chuck 200 can transfer the substrate from the assembly region 510 to the inspection region 520 by only horizontal movement without separate vertical movement.

Meanwhile, a sonic generator for preventing agglomeration of the semiconductor light-emitting diode can be disposed at the assembly region 510. The sonic generator can prevent the plurality of semiconductor light-emitting diodes from agglomerating with each other by vibration.

Meanwhile, bottom surfaces of the assembly region 510 and the inspection region 520 can be made of a light transmissive material. In one embodiment, referring to FIG. 20, light transmission regions 511 and 512 can be provided at the bottom surfaces of the assembly region 510 and the inspection region 520, respectively. Accordingly, the present disclosure enables to monitor the substrate during self-assembly, or to perform inspection with respect to the substrate. It is preferable that an area of the light transmission region is larger than that of the assembly surface of the substrate. However, the present disclosure is not limited thereto, and the assembly chamber can be configured to perform self-assembly and inspection at the same position.

When using the substrate chuck 200, the magnetic field forming part 300, and the assembly chamber 500 as described above, the self-assembly described in FIGS. 8A to 8E can be performed. Hereinafter, a detailed structure and method for solving problems caused during self-assembly will be described in detail.

First, a structure and method for solving the most critical problem that occurs during self-assembly will be described. When describing the problem in detail, as an area of a display increases, an area of an assembly substrate increases, and as the area of the assembly substrate increases, a problem that a warpage phenomenon of the substrate increases occurs. When performing self-assembly in a state in which the assembly substrate is warped, since a magnetic field is not uniformly formed or applied at a surface of the assembly substrate, it is difficult to perform the self-assembly stably.

FIG. 24 is a conceptual diagram showing a substrate warpage phenomenon caused during self-assembly.

Referring to FIG. 24, when a substrate S maintains a flat state during self-assembly, a distance between a plurality of magnets 313 and the substrate S can be uniform. In this case, a magnetic field can be formed uniformly at an assembly surface of the substrate. However, when the substrate is actually loaded onto the substrate chuck 200, the substrate is warped due to gravity. In a warped substrate S', since a distance between the plurality of magnets 313 and the substrate S' is not constant, uniform self-assembly is difficult. Since a magnetic field forming part is disposed on an upper side of the substrate, a separate instrument for correcting the warpage phenomenon of the substrate is difficult to be disposed on the upper side of the substrate. In addition, when the separate instrument for correcting the warpage phenomenon of the substrate is disposed on a lower side the substrate, movement of the semiconductor light-emitting diodes can be restricted, and there is a problem that the instrument covers a part of the assembly surface. For this reason, it is difficult to dispose the instrument for correcting the warpage phenomenon of the substrate either on the upper side or the lower side of the substrate.

The present disclosure provides a structure and method of a substrate chuck for correcting a warpage phenomenon of the substrate.

FIG. 25 is a conceptual diagram showing a method for correcting a warpage phenomenon of a substrate.

Referring to FIG. 25, after loading a substrate S' at a substrate chuck 200, when an assembly surface of the substrate faces the gravity direction, the substrate S' is warped. In order to minimize warping of the substrate when loading the substrate, at least one of first and second frames 210 and 220 provided at the substrate chuck applies pressure to all four corners of a rectangular substrate. Nevertheless, when the area of the substrate S' is increased, the substrate is inevitably warped due to gravity.

As shown in the second drawing of FIG. 25, after the substrate chuck 200 is moved to an assembly position, when the substrate chuck 200 is moved down at a predetermined distance, the substrate S' brings into contact with a fluid F. In a state in which the substrate S' is simply in contact with the fluid F, the warpage phenomenon of the substrate S' is not corrected. Although self-assembly can be performed in a state as shown in the second drawing of FIG. 25, it is difficult to perform uniform self-assembly.

The present disclosure further moves down the substrate chuck 200 in the state in which the substrate S' is in contact with the fluid F in order to correct the warpage phenomenon of the substrate. At this time, a sealing part 212 provided at the first frame 210 prevents the fluid F from penetrating into a window of the first frame. In addition, a sidewall portion 210" provided at the first frame 210 prevents the fluid F from flowing over the first frame to an opposite surface of the assembly surface of the substrate S'.

Here, the sealing part 212 should be formed to surround all edges of the substrate. In addition, a height of the sidewall portion 210" should be greater than a depth at which the first frame 210 is moved down to the maximum based on a state in which the first frame 210 is in contact with the fluid F. That is, when the substrate chuck 200 moves down, the fluid should not penetrate over the window and the sidewall portion 210" of the first frame 210.

When the substrate chuck 200 moves down, a surface of the fluid F is raised due to the sealing part 212 and the sidewall portion 210" as described above. At this time, buoyancy caused by the fluid F acts on the substrate S'. As the surface rising width of the fluid F increases, the buoyancy acting on the substrate S' increases.

In the present disclosure, the buoyancy acting on the substrate can be changed by measuring a degree of warping of the substrate S' and adjusting a descending width of the substrate chuck 200 according to the degree of warping of the substrate. When an appropriate buoyancy is applied to the substrate, as shown in the third drawing of FIG. 25, the substrate S is maintained in a flat state.

The magnetic field forming part 300 is transferred to the upper side of the substrate S in a state in which buoyancy is applied to the substrate S, and then moves horizontally along the substrate S. At this time, power of the power supply 171 is applied to the assembly electrode 161c via the electrode connection part 213. That is, self-assembly proceeds in a state in which buoyancy is applied to the assembly surface of the substrate S.

According to the above description, it is possible to correct the warpage of the substrate without the need to dispose separate structures on the upper and lower sides of the substrate. Through this, the present invention makes it possible to achieve a high self-assembly yield even when the area of the assembly substrate increases.

The above-described chip tray serves to disperse the semiconductor light emitting devices on the surface of the assembling substrate before self-assembly. As described above, the chip tray moves horizontally and vertically with respect to the bottom surface of the assembly chamber, and supplies the semiconductor light emitting device to the surface of the assembly substrate. However, as the area of the assembly substrate increases, there is a problem that the semiconductor light emitting device cannot be uniformly supplied.

Hereinafter, the above-mentioned problem will be described in detail.

Figures 26, 27, 28:
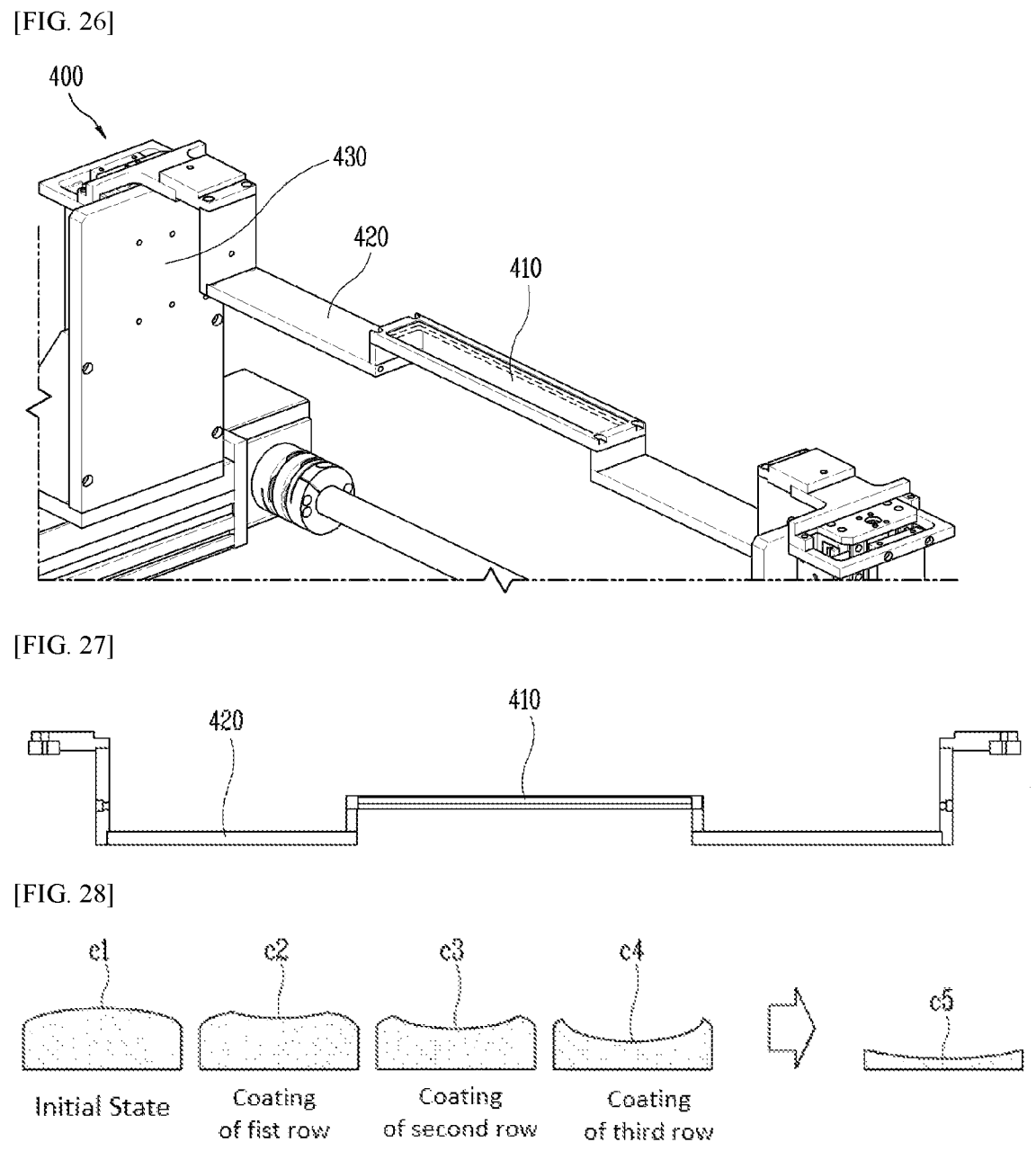

FIG. 26 is a conceptual diagram showing the structure of a related art chip tray, FIG. 27 is a partial cross-sectional view of a related art chip tray, and FIG. 28 is a conceptual diagram showing the form of aggregation of light emitting device remaining in the chip tray when a semiconductor light emitting device is repeatedly supplied to an assembly substrate using the chip tray.

Referring to FIGS. 26 and 27, the related art chip tray 400 includes a tray unit 410, a connection unit 420, and a transfer unit 430. The transfer unit 430 supplies the supplied semiconductor light emitting devices to the assembly substrate.

Specifically, the tray unit 410 receives the semiconductor light emitting device from the chip supply device. The semiconductor light emitting devices supplied on the tray unit exist in an aggregated form in a dome shape (or a central convex shape), and a plurality of the dome shapes are formed at regular intervals. In this specification, a dome-shaped agglomeration of the semiconductor light emitting devices on the tray unit 410 in a dome shape or a convex shape at the center is referred to as a dome-shaped agglomerate. The dome-shaped aggregate includes a plurality of semiconductor light-emitting devices, and a plurality of dome-shaped aggregates are formed at predetermined intervals in the tray unit 410 immediately after receiving the semiconductor light-emitting device from the chip supply device.

When the chip tray supplies the semiconductor light emitting device to the assembly substrate, some of the semiconductor light emitting devices included in each of the dome-shaped aggregates move to the assembly substrate. Hereinafter, as the tray unit 410 supplies the semiconductor light emitting device a plurality of times, the shape of the dome-shaped aggregate will be described.

Referring to FIG. 28, the dome-shaped aggregate c1 in the initial state becomes the concave shapes c2 to c5 as the chips are supplied a plurality of times. After receiving the semiconductor light emitting devices from the chip supply device, the tray unit 410 supplies the semiconductor light emitting devices to the assembly substrate without additional re-supply. The semiconductor light emitting device is supplied in a state of being in a recessed shape. When the semiconductor light emitting device is supplied to the assembly substrate in a state in which the semiconductor light emitting device has a concave shape, the amount of the semiconductor light emitting device supplied may be reduced.

To prevent this problem, whenever the chip tray disperses the semiconductor light emitting device on the assembly substrate, there may be a method of resupplying the semiconductor light emitting device to the chip tray, but there is a problem in that the process time is very long.

The present invention provides a structure for improving the uniformity of the semiconductor light emitting devices supplied on the assembly substrate when the chip tray supplies the semiconductor light emitting devices on the assembly substrate a plurality of times.

Hereinafter, the chip tray according to the present invention will be described in detail.

Figures 29, 30:
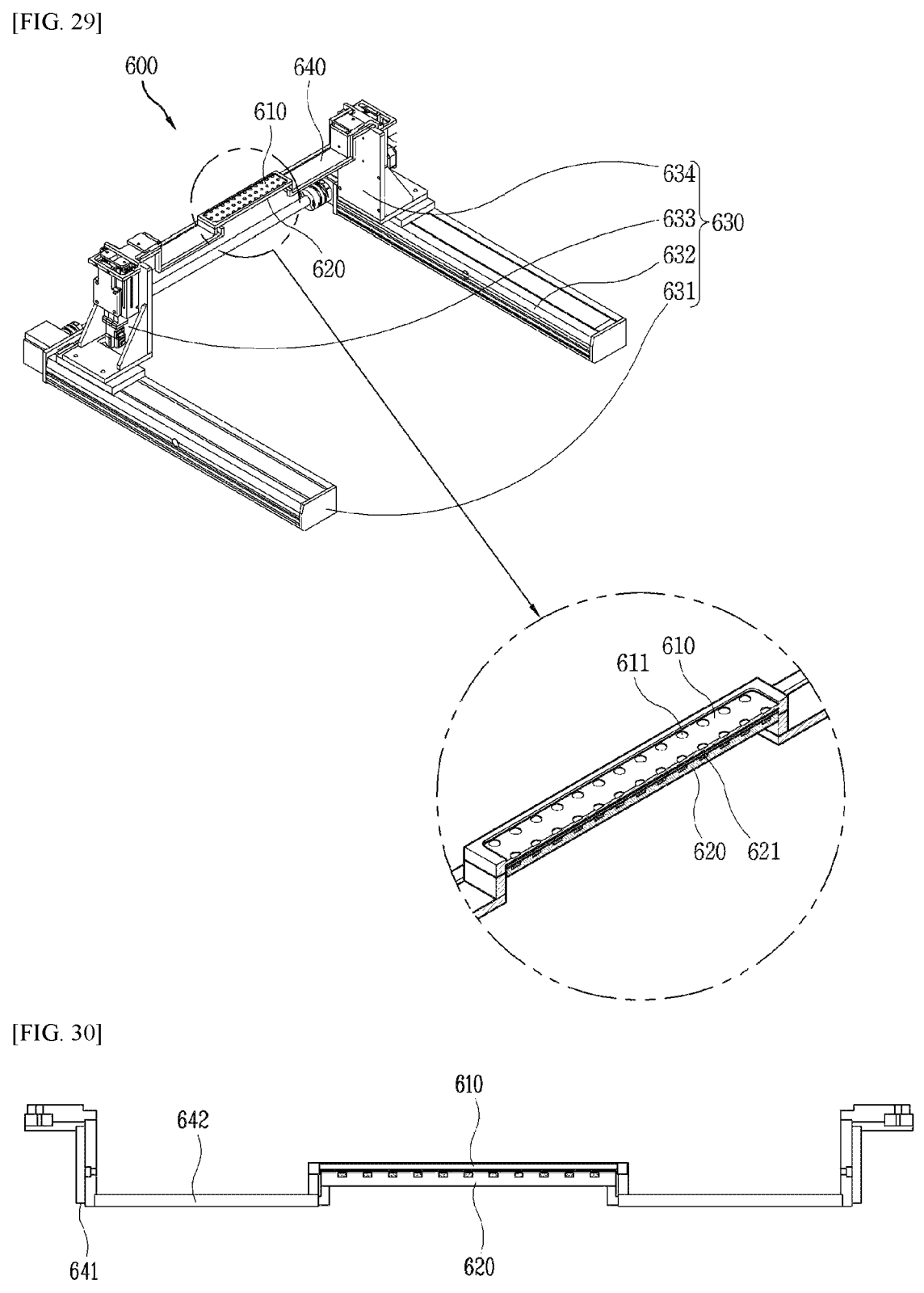

FIG. 29 is a conceptual diagram showing the structure of a chip tray according to the present invention, FIG. 30 is a partial cross-sectional view of the chip tray according to the present invention, and FIG. 31 is a conceptual diagram illustrating an aggregation form of the semiconductor light emitting device remaining in the chip tray when the semiconductor light emitting device is repeatedly supplied to an assembly substrate using the chip tray according to the present invention.

The chip tray 600 according to the present invention serves to supply the semiconductor light emitting device on the assembly surface of the assembly substrate. To this end, the chip tray 600 according to the present invention includes a tray unit 610, a chip alignment unit 620, and a transfer unit 630. The above-described components are disposed in the assembly chamber 500, and when a fluid is accommodated in the assembly chamber 500, at least a portion of the chip tray 600 is submerged in the fluid. Hereinafter, the above-described components will be described in detail.

Referring to the drawings, the tray unit 610 is configured to accommodate the semiconductor light emitting device. Specifically, the tray unit 610 has a bottom part and a side wall part. The semiconductor light emitting devices may be accommodated in a space defined by the bottom portion and the sidewall portion. The tray unit 610 accommodates the semiconductor light emitting device in a state immersed in the fluid accommodated in the assembly chamber 500.

In one embodiment, a plurality of recessed portions 611 may be formed in the bottom portion provided in the tray unit 610. The plurality of recessed portions 611 are formed at regular intervals on the bottom portion, and light emitting devices may be concentrated in the recessed portion 611. Accordingly, a dome-shaped aggregate is formed in the recess portion 611.

Meanwhile, a chip alignment unit 620 may be disposed on one side of the tray unit 610. The chip alignment unit 620 serves to re-aggregate chips after the chip tray 620 supplies the semiconductor light emitting device to the assembly substrate. Specifically, a plurality of magnets 621 are disposed on the chip alignment unit 620. The magnets 621 are arranged at regular intervals. When the tray unit 610 approaches the chip alignment unit 620 within a predetermined distance, the semiconductor light emitting devices are aggregated to a position adjacent to the magnets 621.

In one embodiment, the magnets 621 provided in the chip alignment unit 620 are disposed at the same interval as the recessed portion 611 provided in the tray unit 610 and may be disposed to overlap the recess part 611. Accordingly, when the tray unit 610 is adjacent to the chip alignment unit 620, the semiconductor light emitting devices can be aggregated in each of the recessed portion 611 provided in the tray unit 610. Thereafter, the tray unit 610 may re-supply the semiconductor light emitting devices to the assembly substrate in a state in which the semiconductor light emitting devices are aggregated. Specifically, referring to FIG. 31, immediately after the semiconductor light emitting devices are supplied to the tray unit 610, the semiconductor light emitting devices are aggregated in the same shape as d1. Thereafter, when the tray unit 610 supplies the semiconductor light emitting device to the assembly substrate, the center of the aggregate has a concave shape d2. Thereafter, when the tray unit 610 is adjacent to the chip alignment unit 620, the semiconductor light emitting devices can be re-aggregated to have a shape like d3. While repeating this process, the volume of the agglomerate is reduced little by little, but the semiconductor light emitting device can be supplied in a state in which the shape of the agglomerate remaining in the tray unit 610 is constantly maintained.

For this purpose, movements of the tray unit 610 and the chip alignment unit 620 will be described. The chip tray 600 according to the present invention includes a transfer unit 630) for transferring the tray unit 610 and the chip alignment unit 620. The transfer unit 630 is configured to transfer the tray unit 610 and the chip alignment unit 620 horizontally and vertically with respect to the bottom surface of the assembly chamber.

In one embodiment, the transfer unit 630 transfers the tray unit 610 horizontally and vertically with respect to the bottom surface of the assembly chamber 500, and transfers the chip alignment unit 620 to the assembly chamber 500. It may be made so as to be transported horizontally with respect to the floor surface. Specifically, the transfer unit 630 transports the tray unit 610 and the chip alignment unit 620 together horizontally with respect to the bottom surface of the assembly chamber 500. In the state of the chip alignment unit 620 being fixed, the tray unit 610 may be configured to move vertically with respect to the bottom surface of the assembly chamber 500.

Hereinafter, with respect to the process until the tray unit 610 supplies the semiconductor light emitting device to the assembly substrate, the process of re-aggregating the semiconductor light emitting devices accommodated in the tray unit 610, and the process until the semiconductor light emitting device is re-supplied to the assembly substrate, the movement of the transfer unit, the tray unit and the chip alignment unit will be described below.

First, in a state in which the assembly substrate is immersed in the fluid, the transfer unit 630 transfers the tray unit 610 accommodating the semiconductor light emitting device to the upper side, so that the tray unit 610 is close to the assembly substrate within a predetermined distance. At this time, on the opposite side of the assembly surface of the assembly substrate, the magnet array 300 is in a state close to within a predetermined distance.

As the tray unit 610 approaches the assembly substrate within a predetermined distance, a portion of the semiconductor light emitting device accommodated in the tray unit 610 moves to the assembly substrate. Accordingly, the aggregation shape of the semiconductor light emitting devices aggregated on the tray unit 610 is changed. Specifically, immediately after supplying the semiconductor light emitting device to the assembly substrate, the semiconductor light emitting devices accommodated in the tray unit 610 are in a state in which light emitting devices are aggregated with a hollow in the middle.

Thereafter, the transfer unit 630 lowers the tray unit 610 to move away from the assembly substrate by a predetermined distance or more. At this time, since the chip alignment unit 620 is in a fixed state, as the tray unit 610 descends, the distance between the tray unit 610 and the chip alignment unit 620 becomes closer. As the tray unit 610 approaches the chip alignment unit 620, the semiconductor light emitting devices accommodated in the tray unit 610 are aggregated around magnets provided in the chip alignment unit 620.

Since the semiconductor light emitting devices are excessively aggregated closer to the magnet, as the tray unit 610 approaches the chip alignment unit 620, the semiconductor light emitting devices accommodated in the tray unit 610 are aggregated in a dome shape.

Thereafter, the transfer unit 630 transfers the tray unit 610 and the chip alignment unit 620 in a horizontal direction with respect to the bottom surface of the assembly chamber 500. And the tray unit 610 may overlap with a partial region of the assembly substrate to which the semiconductor light emitting device is not supplied. Thereafter, the transfer unit 630) transports the tray unit 610 vertically with respect to the bottom surface of the assembly chamber 500 to supply the semiconductor light emitting devices to the assembly substrate.

The transfer unit 630 repeats the above-described process until the semiconductor light emitting devices are supplied to the entire assembly substrate. As described above, according to the present invention, the semiconductor light emitting devices can be supplied to the assembly substrate in an aggregated state in the form of a convex center. Through this, the present invention can prevent the amount of semiconductor light emitting devices supplied from the chip tray to the assembly substrate from being reduced even if the number of times the chip tray supplies the semiconductor light emitting devices to the assembly substrate increases. Accordingly, according to the present invention, the semiconductor light emitting device can be uniformly supplied to the entire assembly substrate.

Hereinafter, the structure and connection relationship of the tray unit 610 and the chip alignment unit 620 and the transfer unit 630 will be described. The structure to be described below is an embodiment of the chip tray according to the present invention, and the structure of the chip tray according to the present invention is not limited to the structure to be described later.

FIG. 32 is a conceptual diagram illustrating a state in which the chip aligning unit and the transfer unit are connected, FIG. 33 is a conceptual diagram illustrating a state in which the tray unit and the transfer unit are connected, and FIGS. 34 and 35 are cross-sectional views of the tray unit and the chip aligner.

Referring back to FIG. 29, the transfer unit 630 includes x-axis transfer units 631 and 632 and z-axis transfer units 633 and 634.

The x-axis transfer units 631 and 632 are fixed to the bottom or sidewall of the assembly chamber 500, and the z-axis transfer units 633 and 634 are fixed on the x-axis transfer units 631 and 632. The x-axis transfer units 631 and 632 are configured to horizontally move with respect to the bottom surface of the assembly chamber 500. Since the x-axis transfer units 631 and 632 utilize a related art transfer means, a detailed description of the x-axis transfer units 631 and 632 will be omitted.

The z-axis transfer units 633 and 634 are fixed on the x-axis transfer units 631 and 632. As the x-axis transfer units 631 and 632 move horizontally, the z-axis transfer units 633 and 634 also move together. In an embodiment, the x-axis transfer units 631 and 632 include two transfer units (hereinafter, first and second x-axis transfer units), and the first and second x-axis transfer units 631 and 632 can fix both ends of the z-axis transfer unit. Each of the first and second x-axis transfer units 631 and 632 is fixed to both ends of the assembly chamber. While each of the first and second x-axis transfer units 631 and 632 simultaneously moves in one direction, the z-axis transfer units 633 and 634 are transferred in one direction.

The z-axis transfer units 633 and 634 may include two transfer units (hereinafter, first and second z-axis transfer units). Each of the first and second z-axis transfer units 633 and 634 is fixed to the first and second x-axis transfer units 631 and 632, respectively. A connection unit 640 is fixed to each of the first and second z-axis transfer units 633 and 634.

The connection unit 640 connects the tray unit 610 and the chip alignment unit 620 to the z-axis transfer units 633 and 634, and the tray unit 610 and the chip alignment unit 620 moves along the x-axis transfer units 631 and 632 and the z-axis transfer units 633 and 634.

The connection unit 640 may include two connection units (hereinafter, first and second connection units). Referring to FIG. 32, the first connection unit 641 may be fixed at a position 633 "where no vertical movement of the z-axis transfer units 633 and 634 occurs. Accordingly, the first connection unit 641 only moves horizontally by the x-axis transfer units 631 and 632 and does not move in the vertical direction. The first connection unit 641 is connected to the chip alignment unit 620.

As described above, the chip alignment unit 620 only moves in a horizontal direction with respect to the bottom surface of the assembly chamber 500 and does not move in a vertical direction.

Meanwhile, referring to FIG. 33, the second connection unit 642 is fixed to a position 633' where the vertical movement of the z-axis transfer units 633 and 634 occurs. As the first and second z-axis connectors 633 and 634 generate vertical movement, the second connection unit 642 moves perpendicular to the bottom surface of the assembly chamber 500. The second connection unit 642 is connected to the tray unit 610.

As described above, the tray unit 610 moves in horizontal and vertical directions with respect to the bottom surface of the assembly chamber 500.

Hereinafter, a method of supplying a semiconductor light emitting device using the chip tray 600 including the transfer unit 630 and the connection unit 640 will be described in detail.

First, in a state in which the assembly substrate S is immersed in the fluid, the first and second z-axis transfer units 633 and 634 raise the second connection unit 642 upward with respect to the bottom surface of the assembly chamber 500, so that the tray unit 610 is close to the assembly substrate within a predetermined distance. Accordingly, the chip tray changes from the shape shown in FIG. 34 to the shape shown in FIG. 35. That is, the tray unit 610 is spaced apart from the chip alignment unit 620 by a predetermined distance d. At this time, on the opposite side of the assembly surface of the assembly substrate, the magnet array 300 is in a state close to within a predetermined distance.

As the tray unit 610 approaches the assembly substrate within a predetermined distance, a portion of the semiconductor light emitting device accommodated in the tray unit 610 move to the assembly substrate. Accordingly, the aggregation shape of the semiconductor light emitting devices aggregated on the tray unit 610 is changed. Specifically, immediately after supplying the semiconductor light emitting device to the assembly substrate, the semiconductor light emitting devices accommodated in the tray unit 610 are in a state in which they are aggregated with a hollow in the middle.

Thereafter, the first and second z-axis transfer units 633 and 634 lower the tray unit 610 to move away from the assembly substrate by a predetermined distance or more. At this time, since the chip aligning unit 620 is fixed at a position where the movement of the z-axis transfer units 633 and 634 does not occur, even if vertical movement occurs in the z-axis transfer units 633 and 634, it does not move. As the tray unit descends, the distance between the tray unit and the chip alignment unit becomes closer. Accordingly, the chip tray 600 becomes the shape shown in FIG. 34 from the shape shown in FIG. 35. As the tray unit 610 approaches the chip alignment unit 620, the semiconductor light emitting devices accommodated in the tray unit 610 are aggregated around magnets provided in the chip alignment unit 620.

Since the semiconductor light emitting devices are excessively aggregated closer to the magnet, as the tray unit 610 approaches the chip alignment unit 620, the semiconductor light emitting devices accommodated in the tray unit 610 are aggregated in a convex shape.

Thereafter, the first and second x-axis transfer units 631 and 632 transfer the first and second z-axis transfer units 633 and 634 in a horizontal direction with respect to the bottom surface of the assembly chamber 500. Accordingly, the tray unit 610 and the chip alignment unit 620 are transferred in a horizontal direction with respect to the bottom surface of the assembly chamber. The first and second x-axis transfer units 631 and 632 are connected to the first and second z-axis transfer units 633 and 634 until the tray unit 610 overlaps with a partial region of the assembly substrate to which the semiconductor light emitting device is not supplied. Thereafter, the first and second z-axis transfer units 633 and 634 transport the second connection unit 642 vertically with respect to the assembly substrate so that the tray unit 610 approaches the assembly substrate within a predetermined distance. Accordingly, the semiconductor light emitting devices accommodated in the tray unit 610 can be supplied to the assembly substrate.

According to the present invention, even if the number of times the chip tray supplies the semiconductor light emitting device to the assembly substrate increases, the amount of the semiconductor light emitting device supplied from the chip tray to the assembly substrate cannot be reduced. Accordingly, according to the present invention, the semiconductor light emitting device can be uniformly supplied to the entire assembly substrate.

The invention claimed is:

1. A chip transferring apparatus for transferring semiconductor light emitting devices in a fluid accommodated in an assembly chamber to an assembly surface of an assembly substrate, the chip transferring apparatus comprising:
   a tray unit for accommodating a plurality of semiconductor light emitting devices, wherein the tray unit comprises a plurality of recesses;
   a chip alignment unit disposed on one side of the tray unit and having a plurality of magnets disposed at the same distance as the plurality of recesses;
   a transfer unit configured to transfer the tray unit and the chip alignment unit, unit; and
   a connection unit connecting the tray unit and the chip alignment unit to the transfer unit,
   wherein the transfer unit is configured to vertically move the tray unit with respect to the chip alignment unit.

2. The chip transferring apparatus according to claim 1, wherein the transfer unit is configured to bring the tray unit closer to the assembly substrate within a first distance at which some of the plurality of semiconductor light emitting devices accommodated in the tray unit are aligned on a surface of the assembly substrate submerged in the fluid.

3. The chip transferring apparatus according to claim 2, wherein the transfer unit is configured to bring the tray unit closer to the assembly substrate within the first distance while the tray unit and the chip alignment unit are spaced apart from each other by a predetermined distance.

4. The chip transferring apparatus according to claim 3, wherein the transfer unit is configured to separate the tray unit from the assembly substrate by the first distance or more after some of the plurality of semiconductor light emitting devices accommodated in the tray unit move to the assembly substrate.

5. The chip transferring apparatus according to claim 4, wherein the transfer unit is configured to vertically move so that the tray unit and the chip alignment unit are adjacent to each other within the first distance after some of the plurality of semiconductor light emitting devices accommodated in the tray unit are moved to the assembly substrate.

6. The chip transferring apparatus according to claim 1, wherein the plurality of recesses and the plurality of magnets are arranged to overlap each other.

7. The chip transferring apparatus according to claim 1, wherein the connection unit includes first and second connection units, the first connection unit is configured to connect a portion of the transfer unit in which a vertical movement does not occur and the chip alignment unit.

8. The chip transferring apparatus according to claim 7, wherein the second connection unit is configured to connect a portion of the transfer unit in which a vertical movement occurs and the tray unit.

9. The chip transferring apparatus according to claim 1, wherein the transfer unit is configured to transport the tray unit and the chip alignment unit together horizontally with respect to a bottom surface of the assembly chamber.

10. The chip transferring apparatus according to claim 9, wherein when the chip alignment unit is being fixed, the tray unit is configured to move vertically with respect to the bottom surface of the assembly chamber.

11. The chip transferring apparatus according to claim 1, wherein the connection unit include first and second connection units, and
   wherein the first connection unit is connected to the chip alignment unit.

12. The chip transferring apparatus according to claim 11, wherein the first connection unit is configured to move horizontally and does not move in a vertical direction.

13. The chip transferring apparatus according to claim 11, wherein the second connection unit is connected to the tray unit.

14. The chip transferring apparatus according to claim 13, wherein the second connection unit is configured to move perpendicularly to a bottom surface of the assembly chamber.

* * * * *